United States Patent
Ota

(10) Patent No.: US 9,111,566 B2
(45) Date of Patent: Aug. 18, 2015

(54) CARBON FILM FORMING METHOD, MAGNETIC-RECORDING-MEDIUM MANUFACTURING METHOD, AND CARBON FILM FORMING APPARATUS

(75) Inventor: Ichiro Ota, Chiba (JP)

(73) Assignee: Showa Denko HD Singapore Pte. Ltd., Singapore (SG)

( * ) Notice: Subject to any disclaimer, the term of this patent is extended or adjusted under 35 U.S.C. 154(b) by 886 days.

(21) Appl. No.: 13/321,758

(22) PCT Filed: May 21, 2010

(86) PCT No.: PCT/JP2010/003439
§ 371 (c)(1),
(2), (4) Date: Jan. 9, 2012

(87) PCT Pub. No.: WO2010/134354
PCT Pub. Date: Nov. 25, 2010

(65) Prior Publication Data
US 2012/0128895 A1      May 24, 2012

(30) Foreign Application Priority Data

May 22, 2009   (JP) .................................. 2009-124515

(51) Int. Cl.
*C23C 16/00*     (2006.01)
*G11B 5/84*      (2006.01)
(Continued)

(52) U.S. Cl.
CPC .............. *G11B 5/8404* (2013.01); *C23C 16/26* (2013.01); *C23C 16/50* (2013.01); *G11B 5/855* (2013.01)

(58) Field of Classification Search
CPC ..... C23C 16/26; C23C 16/271; C23C 16/273; C23C 16/50; G11B 5/8404
USPC ........................................................ 427/577
See application file for complete search history.

(56) References Cited

U.S. PATENT DOCUMENTS

| 5,169,452 | A  | * | 12/1992 | Nakayama et al. | ..... 118/723 HC |
| 5,185,067 | A  |   | 2/1993  | Shibahara et al. | |
| 2005/0031797 | A1 | * | 2/2005 | Matsuyama | ................... 427/569 |

FOREIGN PATENT DOCUMENTS

| JP | 61-207575 A | 9/1986 |
| JP | 63127433 A | 5/1988 |

(Continued)

OTHER PUBLICATIONS

Machine translation JP 2000-226659.*
(Continued)

*Primary Examiner* — Elizabeth Burkhart
(74) *Attorney, Agent, or Firm* — Sughrue Mion, PLLC

(57) ABSTRACT

A carbon film forming method including a step in which, inside a film formation chamber provided with a filamentous cathode electrode, an anode electrode disposed around the perimeter of the cathode electrode, and a substrate holder disposed at a position that is separated from the cathode electrode, a disk-like substrate that has a central aperture is disposed in the substrate holder so that one surface of the substrate is opposite the cathode electrode, and a columnar member that has a diameter equal to or greater than a diameter of the central aperture and that has a height equal to or greater than the diameter is disposed with clearance from the cathode electrode and the substrate so that its central axis is coaxial with a central axis of the substrate, one of its circular surfaces is oriented toward the cathode electrode, and its other circular surface is parallel to the one surface of the substrate; and a step in which carbon film is formed on the one surface of the substrate by causing emission of carbon ions from the cathode electrode side toward the substrate side after the interior of the film formation chamber has been evacuated.

13 Claims, 10 Drawing Sheets

(51) Int. Cl.
*C23C 16/26* (2006.01)
*C23C 16/50* (2006.01)
*G11B 5/855* (2006.01)

(56) References Cited

FOREIGN PATENT DOCUMENTS

| JP | 3-79768 A | 4/1991 |
|---|---|---|
| JP | 05140752 A | 6/1993 |
| JP | 8-13143 A | 1/1996 |
| JP | 2000-226659 A | 8/2000 |
| JP | 2001-220681 A | 8/2001 |
| JP | 2003-30823 A | 1/2003 |
| JP | 2005-23403 A | 1/2005 |

OTHER PUBLICATIONS

Machine translation JP 2003-030823.*
Communication dated May 27, 2014, issued by the Japan Patent Office in corresponding Japanese Application No. 2011-514347.
International Search Report dated Jun. 29, 2010 for PCT/JP2010/003439.

* cited by examiner

CARBON FILM FORMING METHOD, MAGNETIC-RECORDING-MEDIUM MANUFACTURING METHOD, AND CARBON FILM FORMING APPARATUS

CROSS REFERENCE TO RELATED APPLICATIONS

This application is a National Stage of International Application No. PCT/JP2010/003439 filed May 21, 2010, claiming priority based on Japanese Patent Application No. 2009-124515, filed May 22, 2009, the contents of all of which are incorporated herein by reference in their entirety.

TECHNICAL FIELD

The present invention relates to a carbon film forming method, a magnetic-recording-medium manufacturing method, and a carbon film forming apparatus.

Priority is claimed on Japanese Patent Application No. 2009-124515, filed May 22, 2009, the content of which is incorporated herein by reference.

BACKGROUND ART

In recent years, improvements in recording density have been remarkable in the field of magnetic recording media that employ hard disk drives (HDD) and the like. Said recording density has continued to rise at a prodigious rate, increasing approximately 100-fold in the last 10 years.

The technologies that support said improvements in recording density are varied, but one may cite a control technology characterized by sliding between a magnetic head and a magnetic recording medium as one key technology.

As one control technology with said sliding property, there is a technology called the Wintester mode. The Wintester mode uses the CSS (Contact Start Stop) method wherein the basic operations from start-up to stoppage of the magnetic head are contact sliding—flotation—contact sliding relative to the magnetic recording medium, and it has become mainstream in hard disk drives. With this technology, contact sliding of the magnetic head on the magnetic recording medium is unavoidable.

Consequently, with this technology, problems of tribology (an academic domain which studies mechanisms and the like of friction, wear, and lubrication) between the magnetic head and the magnetic recording medium have until now remained a fateful technical challenge.

Efforts to improve the protective film which is laminated onto the magnetic film of the magnetic recording medium are ongoing. The wear resistance and slide resistance of the surface (protective film surface) of this medium are major themes in enhancement of the reliability of the magnetic recording medium.

With respect to said protective film, when the flying height of the magnetic head is reduced in order to seek enhanced recording density of the magnetic recording medium, a high degree of slide durability and excellent planarity are required so as to enable protection of the magnetic recording layer of the magnetic recording medium even when said magnetic recording medium and the magnetic head make incidental contact. Moreover, in order to mitigate the spacing loss of the magnetic recording medium and the magnetic head, it is necessary to thin the thickness of said protective film as much as possible, for example, to a film thickness of 30 Å or less.

Thus, with respect to said, protective film, not only is there a strict requirement for smoothness, but also for thinness, fineness, and toughness.

As the material of said protective film, a variety of materials have been proposed, but film composed of carbon (hereinafter "carbon film") has mainly been adopted from the overall standpoint of film formation properties, durability, and the like. Properties of said carbon film such as hardness, density, and dynamic friction coefficient are clearly reflected in the CSS properties or corrosion resistance properties of the magnetic recording medium.

Said carbon film may be formed by the sputtering method, CVD method, ion-beam evaporation method, or the like. However, with respect to carbon film that is formed by the sputtering method, there is the risk of insufficient durability in cases where, for example, a film thickness of 100 Å or less is produced. With respect to carbon film formed by the CVD method, surface smoothness thereof is low. Therefore, when film thickness is thin, there is the risk that the coverage ratio of the surface of the magnetic recording medium may decrease, and that corrosion of the magnetic recording medium may occur.

On the other hand, compared to carbon film formed by the sputtering method or the CVD method, carbon film that is formed by the ion-beam evaporation method is capable of producing film that has higher hardness and greater smoothness, and that is finer. Patent Document 1 discloses one example of a carbon film forming method by the ion-beam evaporation method.

Patent Document 1 relates to a CVD apparatus and a magnetic-recording-medium manufacturing method, and discloses an ion-beam evaporation method which uses thermal filament and a plasma CVD apparatus.

As described in Patent Document 1, with respect to the ion-beam evaporation method, inside a film formation chamber under a vacuum atmosphere, raw material gas of the hydrocarbon system enters a plasma state by electric discharge between an anode and a filamentous cathode that is thermally energized. The carbon ions and carbon radicals which are generated by excitation and decomposition of said raw material gas accelerate and impact the film formation surface of a substrate that is disposed so as to face said cathode and that has minus potential, with the result that carbon film is stably formed with a high degree of hardness.

As said substrate, a disk-like substrate having a circular aperture at the center is ordinarily used. However, in the case where carbon film is formed on said substrate using the ion-beam evaporation method described in Patent Document 1, the thickness of the portion of carbon film at the edge of said aperture tends to become greater than that of other portions. As a cause of this tendency, it is thought that plasma containing carbon ions is irradiated to cluster in the portion at the edge of said aperture, and thereby raising carbon ion concentration, and also that temperature in the portion at the edge of said aperture is greater than that in other portions, increasing the growth speed of carbon film.

In order to prevent occurrence of thickness irregularities, Patent Document 1 describes a configuration wherein a film thickness correction plate is disposed for the purpose of correcting film thickness on the film formation surface side of the substrate. Specifically, a coin-shaped shield (film formation correction plate) is arranged on the film formation surface side of the aperture of the substrate. By this means, plasma density and carbon ion concentration in the vicinity of the aperture of the substrate are reduced, and the growth speed of carbon film in the portion at the edge of the aperture of the substrate is lowered, promoting planarization and smoothening of the carbon film.

However, planarization and smoothening of the carbon film are insufficient even with disposition of the film formation correction plate described in Patent Document 1. That is, the carbon ions which contribute to formation of carbon film include not only flying components which arrive at the film formation surface of the substrate from a direction that is vertical to the film formation surface of the substrate, but also flying components which arrive at the film formation surface of the substrate by flying from other directions. Consequently, even when said coin-shaped shield is set up, a portion of the flying components, which are the carbon ions and are desired to be intercepted, goes around said coin-shaped shield, and forms carbon film on the substrate, thickening film thickness of the carbon film at the edge of the aperture.

When thickness of the carbon film at the edge portion of the aperture becomes greater than that of other portions, the planarity and smoothness of the carbon film is lost. As a result, the problem arises that it becomes difficult to reduce the distance between the magnetic recording medium and the magnetic head, and that the recording density of the magnetic recording medium cannot be improved.

When the diameter of said coin-shaped shield is enlarged in order to prevent wrap-around of carbon ions, deactivated carbon radicals reach the portion at the edge of the aperture of the substrate, where carbon film of low hardness is formed. Carbon film of low hardness is unable to sufficiently exhibit the functions of a protective film of the magnetic recording medium, and corrosion of the magnetic layer occurs from the edge portion of the aperture, reducing the reliability of the magnetic recording medium.

BACKGROUND ART LITERATURE

Patent Documents

Patent Document 1: Japanese Unexamined Patent Application, First Publication No. 2000-226659

SUMMARY OF INVENTION

Problems that the Invention is to Solve

The present invention was made in light of the foregoing circumstances, and its object is to offer a carbon film forming method capable of forming fine carbon film that has a high degree of planarity and smoothness, and that has high hardness, a carbon film forming apparatus, and a method of manufacture of a magnetic recording medium that has high recording density.

Means for Solving the Problems

In order to achieve said purposes, the present invention adopts the following configurations. That is, (1) a carbon film forming method including a step in which, inside a film formation chamber provided with a filamentous cathode electrode, an anode electrode disposed around the perimeter of the cathode electrode, and a substrate holder disposed at a position that is separated from the cathode electrode, a disk-like substrate that has a central aperture is disposed in the substrate holder so that one surface of the substrate is opposite the cathode electrode, and a columnar member that has a diameter equal to or greater than a diameter of the central aperture and that has a height equal to or greater than the diameter is disposed with clearance from the cathode electrode and the substrate so that its central axis is coaxial with a central axis of the substrate, one of its circular surfaces faces the cathode electrode, and its other circular surface is parallel to the aforementioned one surface of the substrate; and a step in which carbon film is formed on the aforementioned one surface of the substrate by causing emission of carbon ions from the cathode electrode side toward the substrate side after the interior of the film formation chamber has been evacuated.

(2) The carbon film forming method described in (1), wherein the central aperture of the substrate is circular, and a diameter of the columnar member is 1-fold or more and less than 1.5-fold of a diameter of the central aperture of the substrate.

(3) The carbon film forming method described in (1) or (2), wherein a height of the columnar member is 3-fold or more and 6-fold or less of a diameter of the columnar member.

(4) The carbon film forming method described in any one of (1)-(3), wherein a clearance between the columnar member and the substrate is 5 mm or more and 40 mm or less.

(5) The carbon film forming method described in any one of (1)-(4), wherein the columnar member is disposed with ungrounded potential (6) The carbon film forming method described in any one of (1)-(5), wherein raw material gas containing carbon that is introduced into the film formation chamber is heated by the cathode electrode, and the carbon ions are formed by electric discharge between the cathode electrode and the anode electrode.

(7) The carbon film forming method described in any one of (1)-(6), wherein the carbon ions are accelerated from the cathode electrode side toward the substrate side by applying voltage between the substrate and the cathode electrode or the anode electrode.

(8) The carbon film forming method described in any one of (1)-(7), wherein a permanent magnet is disposed so as to surround the anode electrode.

(9) A magnetic recording medium manufacturing method, including a step in which a magnetic layer is formed on at least one surface of a non-magnetic substrate, and a step in which carbon film is formed on the magnetic layer using the carbon film forming method described in any one of (1)-(8).

(10) A carbon film forming apparatus, including: a film formation chamber capable of pressure reduction; a filamentous cathode electrode disposed inside the film formation chamber; an anode electrode disposed around the perimeter of the cathode electrode; a substrate holder disposed at a position that is separated from the cathode electrode; a columnar member disposed between the substrate holder and the cathode electrode; a first power source which heats the cathode electrode by energization; a second power source which produces electric discharge between the cathode electrode and the anode electrode; and a third power source which imparts a potential difference between the substrate holder and the cathode electrode or the anode electrode.

(11) The carbon film forming apparatus described in (10), wherein the central aperture of the substrate is circular, a diameter of the columnar member is 1-fold or more and less than 1.5-fold of the diameter of the central aperture of the substrate, a height of the columnar member is 3-fold or more and 6-fold or less of the diameter of the columnar member, a clearance between the columnar member and the substrate is 5 mm or more and 40 mm or less, and the columnar member is disposed with ungrounded potential.

Effects of the Invention

According to the foregoing configurations, it is possible to offer a carbon film forming method capable of forming fine carbon film that has a high degree of planarity and smoothness, and that has high hardness, a carbon film forming apparatus, and a method of manufacture of a magnetic recording medium that has high recording density.

With respect to the carbon film forming method of the present invention, a configuration is adopted wherein, after disposing a disk-like substrate with a central aperture so that one surface faces a cathode electrode, a columnar member having a diameter that is equal to or greater than the diameter of the aforementioned central aperture and a height that is equal to or greater than the aforementioned diameter is disposed with separation so that its central axis is coaxial with the central axis of the aforementioned substrate, one circular surface of the columnar member is oriented toward the aforementioned cathode electrode, and the other circular surface thereof is parallel with the aforementioned one surface of the substrate. Consequently, it is possible to rectify the ion beams and the plasma itself, raise plasma density and the concentration of carbon ions that fly to the surface of the substrate from the direction perpendicular to the surface, inhibit wrap-around of carbon ions, and form fine carbon film that has a high degree of planarity and smoothness, and that has high hardness. Moreover, by inhibiting clustering of ion beams and plasma at the central aperture of the substrate, and by preventing temperature increases in the portion at the edge of the central aperture of the substrate, it is possible to reduce the growth speed of carbon film in the portion at the edge of the central aperture of the substrate, and form carbon film that has a high degree of planarity and smoothness, and that has high hardness.

With respect to the magnetic-recording-medium manufacturing method of the present invention, a configuration is adopted which includes a step in which carbon film is formed on a magnetic layer using the carbon film forming method described above. Consequently, fine carbon film that has a high degree of planarity and smoothness and that has high hardness can be formed as a protective film, and a magnetic recording medium of high recording density can be manufactured by thinning the film thickness of the aforementioned protective layer; and reducing the flotation height of the magnetic head.

With respect to the carbon film forming apparatus of the present invention, a configuration is adopted which has a columnar member disposed between a substrate holder and a cathode electrode. Consequently, it is possible to rectify ion beams and plasma itself, raise plasma density and the concentration of carbon ions that fly to one surface of the substrate from the direction perpendicular to the surface, inhibit wrap-around of carbon ions, and form fine carbon film that has a high degree of planarity and smoothness, and that has high hardness. Moreover, by inhibiting concentration of ion beams and plasma at the central aperture of the substrate, and by preventing temperature increases in the portion at the edge of the central aperture of the substrate, it is possible to reduce the growth speed of carbon film at the edge portion of the central aperture of the substrate, and form fine carbon film that has a high degree of planarity and smoothness, and that has high hardness.

BEST MODE FOR CARRYING OUT THE INVENTION

<<Carbon Film Forming Apparatus>>

Descriptions are given below with respect to preferred modes for implementing the present invention. The present invention is not limited to these examples alone. Modifications, additions, and omissions may be made with respect to materials, numbers, positions, sizes, lengths, numerical values, and the like within a scope that does not depart from the intent of the present invention. With respect to the drawings used in the below descriptions, there are cases where characteristic components are shown enlarged for purposes of convenience in order to facilitate understanding of characteristics, and dimensional proportions and the like of the respective constituent elements are not necessarily identical to their actual values.

Figure 1:
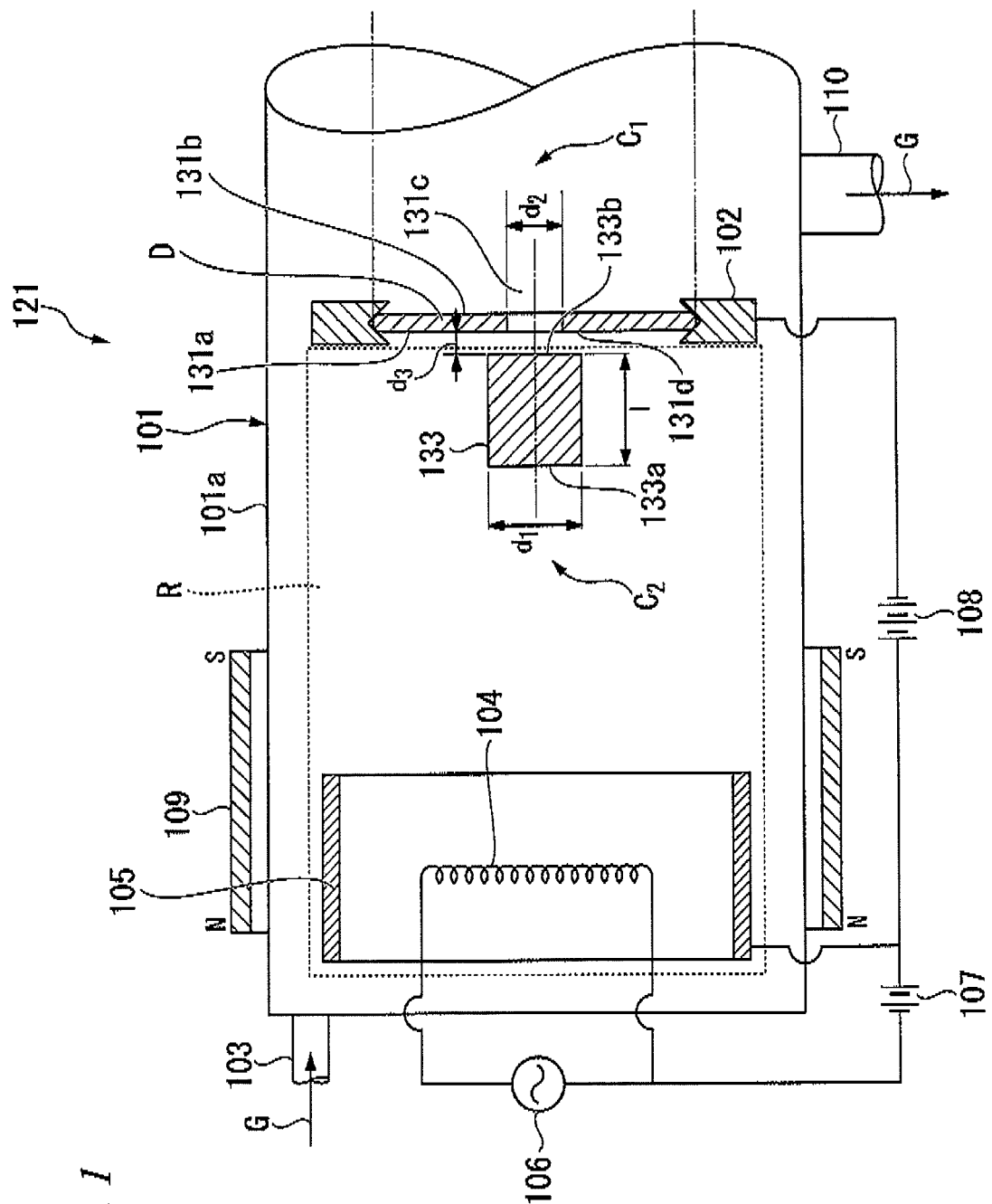
FIG. 1 is a schematic view which shows one example of the carbon film forming apparatus of the present invention.

FIG. 1 is a schematic view which shows a carbon film forming apparatus which is an embodiment of the present invention.

As shown in FIG. 1, a carbon film forming apparatus (film forming apparatus) 121 which is an embodiment of the present invention is a film forming apparatus which uses the ion-beam evaporation method, and is provided with: a film formation chamber 101 capable of reduced pressure; a filamentous cathode electrode 104, an anode electrode 105 disposed around the perimeter of the cathode electrode 104, and a substrate holder 102 disposed at a position that is separated from the cathode electrode 104 which are provided inside the film formation chamber 101; a first inlet tube (hereinafter "raw material gas inlet tube") 103 which is connected to a lateral surface of the film formation chamber 101; and an exhaust tube 110. In the present invention, the anode electrode disposed around the perimeter of the cathode electrode signifies an electrode that is disposed with separation around a cathode electrode that is positioned at the center, and any configuration is acceptable so long as electric discharge is produced between the cathode electrode and the anode electrode. Conditions such as number, size, type, position and the like may be selected as desired. For example, preferable cathode electrode conditions would be a cylindrical shape, square shape using parallel plates, polygon, the form of a hemisphere with hollowed out interior where the open portion is oriented toward the substrate side, the form of a cone with hollowed out interior where the bottom portion is oriented toward the substrate side, or the like. The filamentous cathode electrode of the present invention may use an electrode that is generally known as a filament electrode, and one may cite, for example, a coil form, linear form, planar serpentine form, and the like.

With respect to the substrate holder 102, a substrate D is supported so that one surface (film formation surface) 131a of the substrate D faces the cathode electrode 104. Furthermore, a columnar shield (hereinafter "columnar member") 133 is disposed with separation so that one circular surface 133a is oriented toward the cathode electrode 104, while the other circular surface 133b is parallel to the one surface 131a of the substrate D.

<Film Formation Chamber 101>

The film formation chamber 101 has an airtight configuration due to a chamber wall 101a. Moreover, the film formation chamber 101 is connected to the exhaust tube 110, and its interior is capable of pressure reduction and evacuation through a vacuum pump (not illustrated in the drawings) connected to the exhaust tube 110.

<First to Third Power Sources>

Outside the film formation chamber 101 are disposed a first power source 106 which heats the cathode electrode 104 by energization, a second power source 107 which produces electric discharge between the cathode electrode 104 and the anode electrode 105, and a third power source 108 which imparts a potential difference by applying voltage between the substrate D and the cathode electrode 104 or anode electrode 105.

The first power source 106 is an AC power source connected to the cathode electrode 104, and enables power supply to the cathode electrode 104 during formation of carbon film. The first power source 106 is not limited to an AC power source; use of a DC power source is also acceptable.

The second power source 107 is a DC power source wherein the − (negative) electrode side is connected to the cathode electrode 104, and the + (positive) electrode side is connected to the anode electrode 105, enabling production of electric discharge between the cathode electrode 104 and the anode electrode 105 during formation of carbon film.

The third power source 108 is a DC power source wherein the + electrode side is connected to the anode electrode 105, while the − electrode side is connected to the holder 102, which enables a potential difference to be imparted between the anode electrode 105 and the substrate D held in the holder 102 during formation of carbon film. The third power source 108 may also be configured to have the + electrode side connected to the cathode electrode 104.

Otherwise, there are no particular limitations on the voltage that is applied by operation of the first power source 106, second power source 107, and third power source 108, and it is preferable to appropriately select it according to the size of the substrate D.

For example, in the case where the substrate D has a disk-like structure, and has a size of 3.5 inches in external diameter, it is preferable that the voltage of the first power source 106 be set to a range of 10 to 100 V, and that its current be set to a range of 5 to 50 A in terms of direct current or alternating current. With respect to the second power source 107, it is preferable that voltage be set to a range of 50 to 300 V, and that current be set to a range of 10 to 5000 mA. Furthermore, with respect to the third power source 108, it is preferable that voltage be set to a range of 30 to 500 V, and that current be set to a range of 10 to 200 mA.

<Raw Material Gas>

A gas (hereinafter "raw material gas") G containing carbon is introduced into the film formation chamber 101 from the raw material gas inlet tube 103.

As the raw material gas G, one may cite gas that contains hydrocarbon. The raw material gas G may be configured from hydrocarbon alone. As necessary, the hydrocarbon may be hydrocarbon that includes other elements such as nitrogen, fluorine, or the like. As the aforementioned hydrocarbon, it is preferable to use lower hydrocarbon of any one or two or more types among lower saturated hydrocarbon, lower unsaturated hydrocarbon, or lower cyclic hydrocarbon. The term "lower" as used here refers to the case of a carbon number of 1 to 10.

In the case where the carbon number of the aforementioned hydrocarbon exceeds 10, not only is supply as raw material gas from the gas inlet tube 103 inhibited, but also decomposition of the hydrocarbon contained in the raw material gas G during electric discharge is retarded, and the carbon film formed on the substrate is a film that contains an abundance of polymer components which is inferior in strength.

As lower saturated hydrocarbon, methane, ethane, propane, butane, octane, and the like can be cited. As lower unsaturated hydrocarbon, isoprene, ethylene, propylene, butylene, butadiene, and the like can be cited. Furthermore, as low cyclic hydrocarbon, benzene, toluene, xylene, styrene, naphthalene, cyclohexane, cyclohexadiene, and the like can be cited.

Furthermore, it is preferable that a gas mixture or the like be used which includes inert gas such as Ar, He, $H_2$, $N_2$, and $O_2$ or hydrogen gas or the like in the raw material gas G. With respect to the mixing ratio of hydrocarbon and inert gas or the like in this gas mixture, it is preferable that hydrocarbon:inert gas be in a range from 2:1 to 1:100 (volume ratio); a range of 1.5:1 to 1:75 (volume ratio) is more preferable; and a range of 1:1 to 1:50 (volume ratio) is still more preferable. By this means, it is possible to induce generation of plasma within the film formation chamber 101, and form carbon film that has high hardness and high durability.

<Permanent Magnet>

It is preferable that a cylindrical permanent magnet 109 be provided outside the film formation chamber 101 so as to surround the anode electrode 105. It is preferable that the permanent magnet 109 be disposed so as to surround at least a portion of a region (hereinafter "excitation space R") wherein the raw material gas G is ionified, and the aforementioned ionified gas (hereinafter "ion beams") is accelerated. By this means, a magnetic field can be applied between the cathode electrode 104 and the anode electrode 105 or substrate D, and the ion density of carbon ions which accelerate toward and irradiate the surface 131a of the substrate D can be increased. Conditions such as the number, size, magnetic force, form, and position of the permanent magnet(s) may be selected as desired. From the standpoint of achieving a uniform distribution of the magnetic field in the ion acceleration region, it is preferable to dispose numerous permanent magnets with rotational symmetry relative to an axis connecting the anode electrode and the substrate.

<Substrate>

As the substrate D, a disk-like substrate is used which has a circular aperture 131c at the center (hereinafter "central aperture"). As shown in FIG. 1, the diameter of the central aperture 131c is designated $d_2$.

As the substrate for the magnetic recording medium, a preferred substrate can be selected at one's discretion, and one may enumerate here a substrate of 0.85-inch external diameter (external diameter of 21.6 mm and central aperture diameter of 6 mm), a substrate of 1.9-inch external diameter (external diameter of 48 mm and central aperture diameter of 12 mm), a substrate of 2.5-inch external diameter (external diameter of 65 mm and central aperture diameter of 20 mm), a substrate of 3.5-inch external diameter (external diameter of 95 mm and central aperture diameter of 25 mm), and so on.

<Columnar Member>

The columnar member 133 is a column-shaped member whose diameter $d_1$ is larger than the diameter $d_2$ of the central aperture 131c of the substrate D, and the height l of the columnar member 133 is greater than the diameter $d_1$ of the columnar member 133.

The columnar member 133 is disposed between the substrate D and the cathode electrode 104 so that its circular surface 133a is oriented toward the cathode electrode 104. Moreover, the other circular surface 133b of the columnar member 133 is disposed parallel to the surface 131a of the substrate D, with clearance from the surface 131a of the substrate D. Furthermore, a central axis $C_2$ of the columnar member 133 is disposed so as to be coaxial with a central axis $C_1$ of the substrate D.

It is preferable that the diameter $d_1$ of the columnar member 133 be from 1-fold or more to less than 1.5-fold of the diameter $d_2$ of the central aperture 131c of the substrate D.

By setting the diameter $d_1$ of the columnar member 133 from 1-fold or more to less than 1.5-fold of the diameter $d_2$ of the central aperture 131c of the substrate D, it is possible to dispose the columnar member 133 so that only a portion 131d which exists at the edge of the central aperture 131c of the substrate D is shielded, and render the thickness of the carbon film of the portion 131d at the edge of the central aperture 131c of the substrate D more planar and smooth.

In the case where the diameter $d_1$ of the columnar member 133 is less than 1-fold of the diameter $d_2$ of the central aperture 131c of the substrate D, the shielding effect of the columnar member 133 is lost, reducing the planarity and smoothness of the carbon film formed in the portion 131d at the edge of the central aperture 131c of the substrate D.

Conversely, in the case where the diameter $d_1$ of the columnar member 133 exceeds 1.5-fold of the diameter $d_2$ of the central aperture 131c of the substrate D, the shielding effect of the columnar member 133 is overly large, and carbon film is either not deposited in the portion 131d at the edge of the central aperture 131c of the substrate D, or an excessively thin carbon film portion is formed in the edge portion.

It is preferable that the height of the columnar member 133 be from 3-fold or more and 6-fold or less of the diameter $d_1$ of the columnar member 133, and from 3.5-fold or more and 5-fold or less is more preferable.

By setting the height l of the columnar member 133 to from 3-fold or more and 6-fold or less of the diameter $d_1$ of the columnar member 133, the effect which rectifies ion beams and plasma can be more prominently obtained. Consequently, it is possible to better prevent clustering of ion beams and plasma at the central aperture 131c of the substrate D, further raise plasma density and the concentration of carbon ions that fly to the surface 131a of the substrate D from the direction perpendicular to the surface, and form fine carbon film of higher planarity and smoothness, and high hardness.

In the case where the height l of the columnar member 133 is less than 3-fold of the diameter $d_1$ of the columnar member 133, there is an increase of carbon ions other than flying components, that fly to the surface 131a of the substrate D from the direction perpendicular to the surface, and the thickness of the carbon film increases at the periphery of the central aperture 131c of the substrate D due to wrap-around of carbon ions.

Conversely, in the case where the height l of the columnar member 133 exceeds 6-fold of the diameter $d_1$ of the columnar member 133, rectification of ion beams and plasma is excessive. As a result, there is a decrease in plasma density and ion beams which flow at the periphery of the columnar member 133, there is a reduction in the excitation force of carbon ions in the excitation space R which is the plasma space, and there is a decrease in the hardness of the carbon film which is formed on the one surface 131a of the substrate D.

It is preferable that a clearance $d_3$ between the columnar member 133 and the substrate D be 5 mm or more, and 40 mm or less. Within this range, 20 mm or less is more preferable.

By setting the clearance $d_3$ between the columnar member 133 and the substrate D to 5 mm or more and 40 mm or less, the thickness of carbon film in the portion 131d which is the edge portion of the central aperture 131c of the substrate D can be made more planar and smoother, and fine carbon film of high hardness can be formed.

In the case where the clearance $d_3$ between the columnar member 133 and the substrate D is less than 5 mm, carbon radicals which reach the portion 131d which is the edge portion of the central aperture 131c of the substrate D are deactivated, lowering the hardness of the carbon film that is deposited in the portion 131d which is the edge portion of the central aperture 131c of the substrate D.

Conversely, in the case where the clearance $d_3$ between the columnar member 133 and the substrate D exceeds 40 mm, the shielding effect of the columnar member 133 decreases, reducing the planarity and smoothness of the carbon film formed in the portion 131d which is the edge portion of the central aperture 131c of the substrate D.

It is preferable that the columnar member 133 be disposed with ungrounded potential (floating potential). By disposing the columnar member 133 with ungrounded potential (floating potential), it is possible to have a configuration where the flight of carbon ions is not blocked, and to vertically irradiate the one surface 131a of the substrate D with carbon ions.

With the carbon film forming apparatus shown in FIG. 1, a configuration is obtained wherein carbon film is formed only on the one surface 131a of the substrate D. However, it is also acceptable to prepare two of the same apparatuses, which can be used for forming one carbon film on the surface 131a of the substrate D, and to have a configuration wherein the two apparatuses are disposed on both sides of the interposed substrate D within the film formation chamber 101, and carbon film is formed on the both two surfaces 131a and 131b of the substrate D.

In the present invention, the columnar member 133 is not limited to the columnar member shown in the present embodiment in which multiple facets have the same circular form as one surface, and other columnar members may also be included. For example, it is also acceptable to use a circular truncated cone, a polygonal column such as a tetragonal column or pentagonal column, and so on.

In the case where a polygonal column or a circular truncated cone is used, the diameter $d_1$ and height l exhibit their maximum dimensions. That is, in the case of a tetragonal column, the length of a diagonal line of the bottom surface is $d_1$. In the case of a circular truncated cone, the diameter of the surface with the larger diameter is $d_1$. In either case, a member is used in which the height l is larger than $d_1$, and $d_1$ is larger than the diameter $d_2$ of the central aperture 131c of the substrate D.

However, among these, a columnar member (cylindrical member) like that described above is most preferable as the columnar member 133.

<<Carbon Film Forming Method>>

Next, a description is given of a carbon film forming method which is an embodiment of the present invention.

A carbon film forming method which is an embodiment of the present invention is implemented using a carbon film forming apparatus which is an embodiment of the present invention, and has a columnar member disposition step and a carbon film formation step. Components identical to the components shown in the carbon film forming apparatus which is the embodiment of the present invention are assigned the same reference symbols for purposes of description.

<Columnar Member Disposition Step>

First, inside the film formation chamber 101 provided with the filamentous cathode electrode 104, the anode electrode 105 disposed around the perimeter of the cathode electrode 104, and the substrate holder 102 disposed at a position that is separated from the aforementioned cathode electrode 104, the disk-like substrate D that has the central aperture 131c is disposed in the substrate holder 102 so that the one surface 131a faces the cathode electrode 104.

Next, the columnar member 133 is disposed between the substrate D and the cathode electrode 104. At this time, the circular surface 133a of the columnar member 133 is oriented toward the cathode electrode 104, the other circular surface 133b parallels the surface 131a of the substrate D, and the columnar member 133 is disposed with clearance from the surface 131a of the substrate D. Moreover, the central axis $C_2$ of the columnar member 133 is disposed so that it is coaxial with the central axis $C_1$ of the substrate D.

<Carbon Film Formation Step>

First, the vacuum pump connected to the exhaust tube 110 is operated, and pressure is reduced inside the film formation chamber 101. The extent of pressure reduction may be selected as necessary from the standpoint of productivity, but a higher degree of vacuum is preferable.

Next, the raw material gas G is introduced into the film formation chamber 101 from the raw material gas inlet tube 103 that is connected to the film formation chamber 101.

Next, power is supplied from the first power source 106, the filamentous cathode electrode 104 is heated by energization, and thermal plasma is generated. In addition, plasma is generated by causing electric discharge between the cathode electrode 104 and the anode electrode 105 by operating the second power source 107. By this means, the raw material gas G is excited and decomposed, forming carbon ions. There are also cases where the aforementioned carbon ions contain carbon radicals. The heating temperature of the cathode electrode due to heating by energization may be set as desired, but a higher temperature is preferable for purposes of increasing the excitation force and the decomposition of the raw material gas G in the cathode electrode.

Next, voltage is applied between the substrate D and the cathode electrode 104 or the anode electrode 105 by the third power source 108, imparting a potential difference, accelerating the aforementioned carbon ions toward the substrate D that has been set to a minus potential, and irradiating the one surface 131a of the substrate D. The aforementioned carbon ions impact the surface 131a of the substrate D, forming carbon film. As the aforementioned carbon ions are in an excited, high-energy state, fine carbon film is formed with a high degree of planarity and smoothness, and high hardness.

The columnar member 133 is disposed at the side of the one surface 131a of the substrate D so as to shield the central aperture 131c. By this means, the plasma itself and the ion beams that flow around the columnar member 133 are rectified, preventing clustering of plasma and ion beams at the central aperture 131c of the substrate D. By preventing clustering of plasma and ion beams at the central aperture 131c of the substrate D, the plasma density and the carbon ion density at the periphery of the central aperture 131c of the substrate D are reduced, and carbon film growth speed at the periphery of the central aperture 131c of the substrate D decreases.

By preventing clustering of ion beams and plasma at the central aperture 131c of the substrate D, temperature increases in the edge portion 131d of the central aperture 131c of the substrate D (edge portion) is prevented, the growth speed of carbon film in the portion 131d is reduced at the edge of the central aperture 131c of the substrate D, and fine carbon film is formed with a high degree of planarity and smoothness, and high hardness.

Furthermore, by rectifying the ion beams and the plasma itself, plasma density and the concentration of carbon ions that fly to the surface 131a of the substrate D from the direction perpendicular to the surface are increased, formation of carbon film with low hardness due to wrap-around of carbon ions is inhibited, and fine carbon film is formed with a high degree of planarity and smoothness, and high hardness.

A magnetic field is applied by the permanent magnet(s) 109 in the excitation space R which is the region where the aforementioned carbon ions are accelerated. By this means, it is possible to raise the ion density of the aforementioned carbon ions which accelerate toward and irradiate the surface 131a of the substrate D, and form fine carbon film that has a higher degree of planarity and smoothness, and that has higher hardness.

A carbon film thickness of 5 nm or less is preferable, and 3 nm or less is more preferable. By thinly forming the thickness of the carbon film to 5 nm or less, the distance between the magnetic head and the magnetic layer is shortened, and the recording density of the magnetic recording medium can be enhanced. It is preferable to set the lower limit of carbon film thickness at the lower limit where protective capability with respect to the magnetic recording medium is satisfied.

<The Magnetic Field Applied by the Permanent Magnet(s), and its Magnetic Field Lines>

Figure 2A:
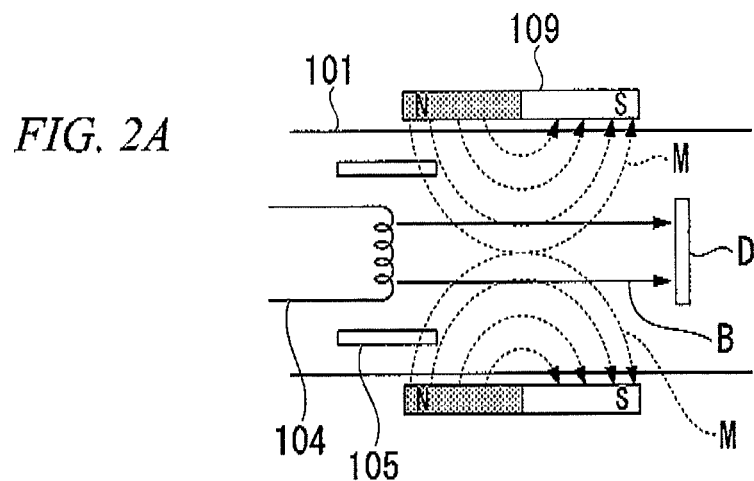
FIG. 2A is a schematic view which shows one example of a magnetic field applied by a permanent magnet and the direction of its magnetic field lines in the carbon film forming apparatus of the present invention.
Figure 2B:
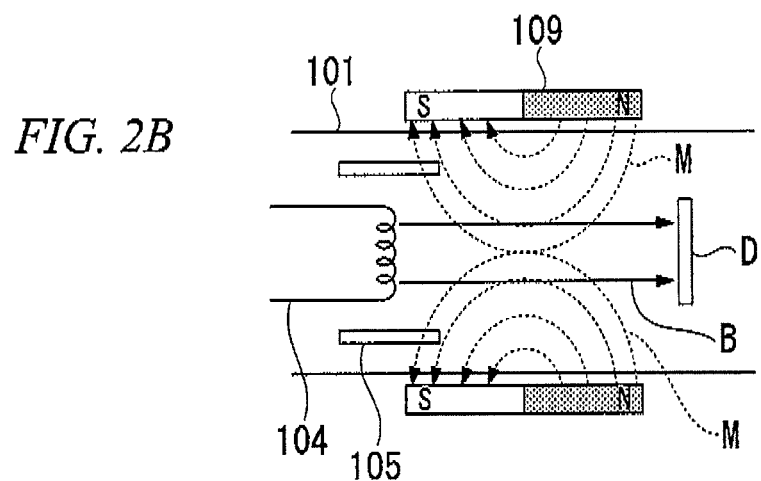
FIG. 2B is a schematic view which shows one example of a magnetic field applied by a permanent magnet and the direction of its magnetic field lines in the carbon film forming apparatus of the present invention.
Figure 2C:
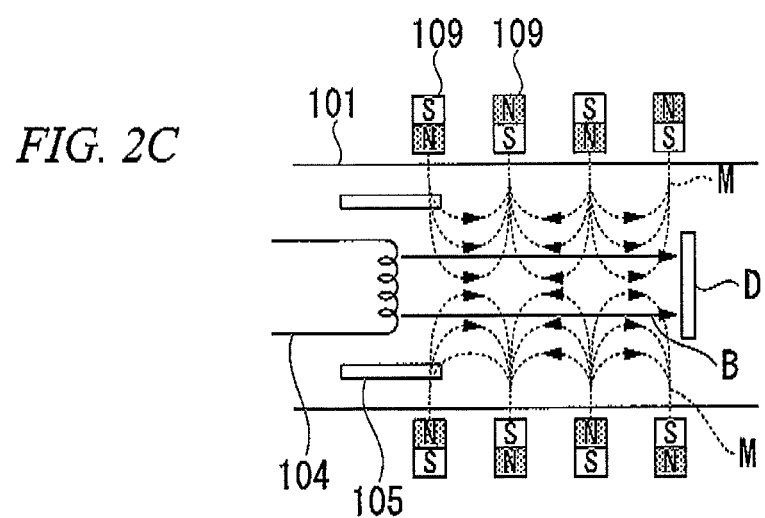
FIG. 2C is a schematic view which shows one example of magnetic fields applied by permanent magnets and the direction of their magnetic field lines in the carbon film forming apparatus of the present invention.

FIG. 2A-FIG. 2C are schematic views which show examples of magnetic fields applied by the permanent magnet(s) provided in the film forming apparatus shown in FIG. 1, and the direction of their magnetic field lines.

FIG. 2A shows an example wherein the permanent magnets 109 are disposed at the perimeter of the chamber wall 101a of the film formation chamber 101 so that the S pole is on the substrate D side, and the N pole is on the cathode electrode 104 side. FIG. 2B shows an example wherein the permanent magnets 109 are disposed at the perimeter of the chamber wall 101a of the film formation chamber 101 so that the S pole is on the cathode electrode 104 side, and the N pole is on the substrate D side. Furthermore, FIG. 2C shows an example wherein multiple permanent magnets 109 are disposed at the perimeter of the chamber wall 101a of the film formation chamber 101 so that the orientation of the N poles and S poles of the magnets is alternately changed between the inner circumferential side and outer circumferential side.

With any of the configurations shown in FIG. 2A to FIG. 2C, in the vicinity of the center of the film formation chamber 101, magnetic lines M of force produced by the permanent magnet(s) 109 approximately parallel the acceleration direction of carbon ions (hereinafter "ion beams") B which performs accelerated irradiation. The ion beams B can be rectified so that they follow the direction of the magnetic lines M produced by the permanent magnet(s) 109, that is, so that the vertical direction relative to the surface 131a of the substrate D is the primary direction, and wrap-around to the rear side of the columnar member 133 can be reduced.

Moreover, as the carbon ions of the ion beams B have a magnetic moment, they converge in the vicinity of the center within the excitation space R inside the film formation chamber 101 due to the magnetic field(s) produced by the permanent magnet(s) 109, enabling raising of the ion density of carbon ions in the ion beams B that contribute to carbon film formation, and formation of fine carbon film with a higher degree of planarity and smoothness, and higher hardness.

<<Magnetic-Recording-Medium Manufacturing Method>>

First, a description is given with respect to a magnetic recording medium and a magnetic recording and reproducing apparatus.

<Magnetic Recording Medium>

Figure 3:
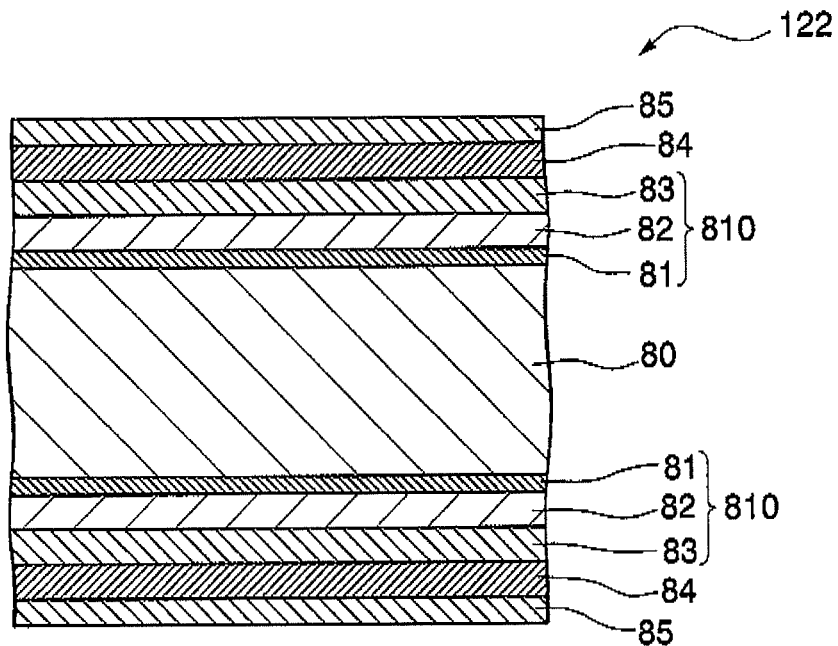
FIG. 3 is a sectional view which shows one example of a magnetic recording medium manufactured using the magnetic-recording-medium manufacturing method of the present invention.

FIG. 3 is a sectional view which shows one example of a magnetic recording medium manufactured using a magnetic-recording-medium manufacturing method which is an embodiment of the present invention.

As shown in FIG. 3, a magnetic recording medium 122 is configured by sequential lamination of a magnetic layer 810, a protective layer 84, and a lubricating film 85 on each of the two sides of a non-magnetic substrate 80. Moreover, the magnetic layer 810 is composed by sequential lamination of a soft magnetic layer 81, an intermediate layer 82, and a recording magnetic layer 83 from the non-magnetic substrate 80 side.

<Protective Layer>

The protective layer 84 is formed on the magnetic layer 810. The protective layer 84 is carbon film which is compact and has high hardness, and is formed using a carbon film forming method which is an embodiment of the present invention. Consequently, even when the thickness of the protective layer 84 is thinned to, for example, 2 nm or less, it is possible to preserve the effects of protective film.

In the case where the magnetic recording medium 122 is loaded onto a hard disk drive apparatus (HDD apparatus) or the like, it is possible to narrowly set the distance between the magnetic recording medium 122 and the magnetic head by thinning the thickness of the protective layer 84. By this structure, the recording density of the magnetic recording medium 122 can be increased. Moreover, as the protective layer 84 is compact carbon film of high hardness, it is possible to raise the corrosion resistance of the magnetic recording medium 122.

<Non-Magnetic Substrate>

As the non-magnetic substrate 80, any substrate can be used optionally in so far as the substrate is a non-magnetic substrate. Examples thereof include an Al alloy substrate whose primary component is Al such as, for example, an Al—Mg alloy; and substrates composed of ordinary soda glass, aluminosilicate glass, crystallized glass, silicon, titanium, ceramic, and various types of resin.

Among these, it is preferable to use an Al alloy substrate, or a glass substrate of crystallized glass or the like, or a silicon substrate. The average surface roughness (Ra) of these substrates is preferably 1 nm or less, more preferably 0.5 nm or less, and still more preferably 0.1 nm or less.

<Magnetic Layer>

With respect to the magnetic layer 810, either a longitudinal magnetic layer for use with a longitudinal magnetic recording medium or a perpendicular magnetic layer for use with a perpendicular magnetic recording medium is acceptable, but a perpendicular magnetic layer is preferable for purposes of achieving higher recording density.

Moreover, it is preferable to form the magnetic layer 810 mainly from an alloy whose primary component is Co. For example, as a magnetic layer 810 for a perpendicular magnetic recording medium, one may use a layer in which is laminated a soft magnetic layer 81 composed of, for example, a soft magnetic FeCo alloy (FeCoB, FeCoSiB, FeCoZr, FeCoZrB, FeCoZrBCu, and the like), FeTa alloy (FeTaN, FeTaC, and the like), or Co alloy (CoTaZr, CoZrNB, CoB, and the like), an intermediate layer 82 composed of Ru or the like, and a recording magnetic layer 83 composed of 70 Co-15 Cr-15 Pt alloy or 70 Co-5 Cr-15 Pt-10 $SiO_2$ alloy. In addition, it is also acceptable to laminate an orientation control film composed of Pt, Pd, NiCr, NiFeCr or the like between the soft magnetic layer 81 and the intermediate layer 82.

On the other hand, as a magnetic layer 810 for a longitudinal magnetic recording medium, one may use a layer in which is laminated a non-magnetic CrMo base layer and a ferromagnetic CoCrPtTa magnetic layer.

It is preferable that the overall thickness of the magnetic layer 810 be from 3 nm or more to 20 nm or less; from 5 nm or more to 15 nm or less is more preferable. The magnetic layer 810 may be adapted to the laminar structure and the employed types of magnetic alloy, and formed so as to obtain sufficient head input/output. With respect to the thickness of the magnetic layer 810, a magnetic layer thickness of a certain level or above is required to obtain output of a fixed level or higher during reproduction. On the other hand, as it is commonly the case that the various parameters expressing recording and reproducing properties deteriorate in conjunction with increased output, it is necessary to set an optimum thickness.

<Lubricating Film>

As the lubricant used for the lubricating film 85, one may use a fluoro-liquid lubricant such as perfluoroether (PFPE), a solid lubricant such as fatty acid, and so on. The lubricating film 85 is ordinarily formed to a thickness of 1 to 4 nm. As an application method for the lubricant, one may use conventional, known methods such as dipping and spin coating.

Figure 4:
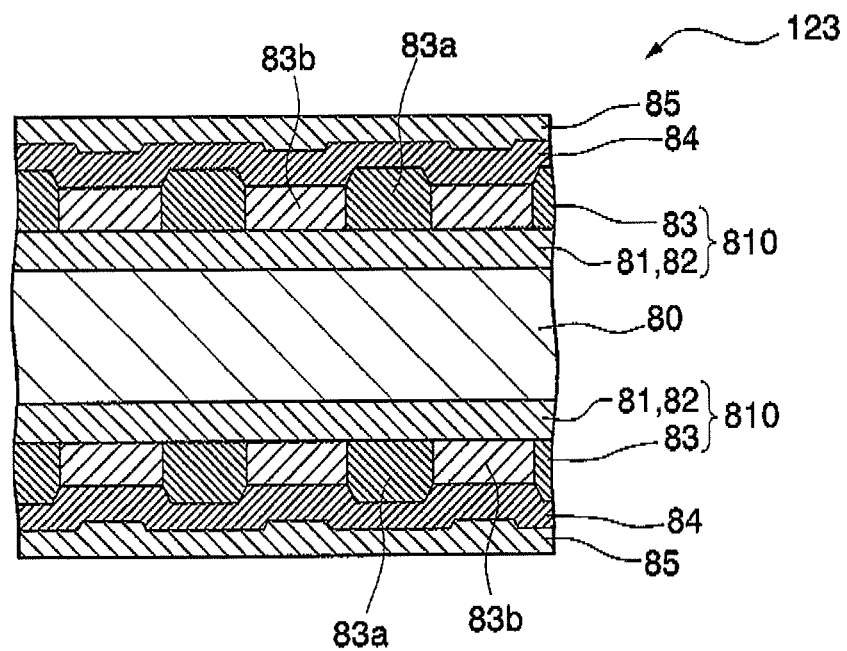
FIG. 4 is a sectional view which shows another example of a magnetic recording medium manufactured using the magnetic-recording-medium manufacturing method of the present invention.

FIG. 4 is a sectional view which shows another example of a magnetic recording medium manufactured using a magnetic-recording-medium manufacturing method which is an embodiment of the present invention.

As shown in FIG. 4, a magnetic recording medium 123 is configured by sequential lamination of the magnetic layer 810, the protective layer 84, and the lubricating film 85 on both sides of the non-magnetic substrate 80. The protective layer 84 is formed on the magnetic layer 810. Moreover, the magnetic layer 810 is constituted by sequential lamination of the soft magnetic layer 81 and/or the intermediate layer 82, and the recording magnetic layer 83 from the non-magnetic substrate 80 side. Furthermore, in the recording magnetic layer 83, a magnetic recording pattern 83a is formed by separating the layer by non-magnetic regions 83b, creating a so-called discrete type of magnetic recording medium.

The aforementioned discrete type of magnetic recording medium may be so-called patterned media wherein the magnetic recording pattern 83a is arranged with fixed regularity per bit, media wherein the magnetic recording pattern 83a is arranged in track form, or other media wherein the magnetic recording pattern 83a contains servo signal patterns or the like.

With respect to preparation of the aforementioned discrete type of magnetic recording medium, after a mask layer has been provided on the surface of the recording magnetic layer 83, sites that are not covered by the aforementioned mask layer are exposed to reactive plasma treatment or ion irradiation treatment or the like, whereby portions of the recording magnetic layer 83 are modified from magnetic material to non-magnetic material, and the non-magnetic regions 83b are formed.

<Magnetic Recording and Reproducing Apparatus>

Figure 5:
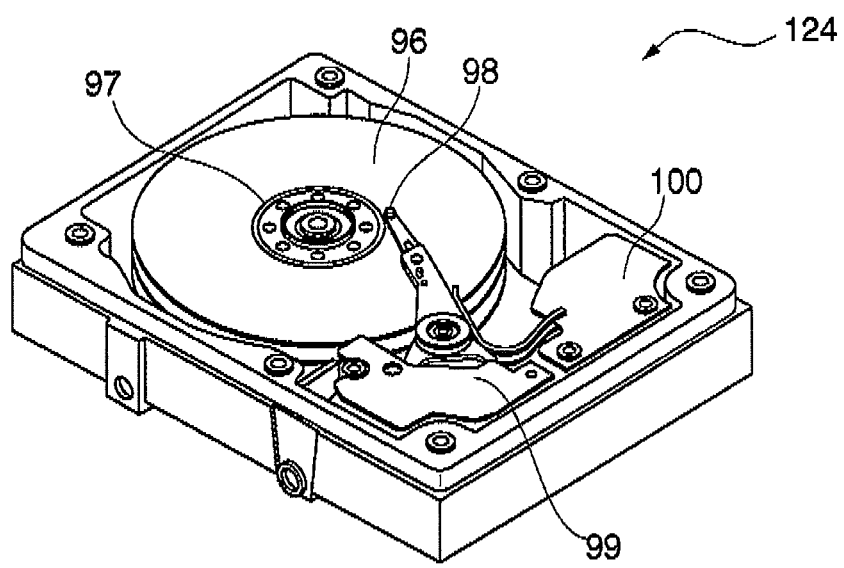
FIG. 5 is a sectional view which shows one example of a magnetic recording and reproducing apparatus provided with a magnetic recording medium manufactured using the magnetic-recording-medium manufacturing method of the present invention.

FIG. 5 is a sectional view which shows one example of a magnetic recording and reproducing apparatus in which is loaded a magnetic recording medium manufactured using a magnetic-recording-medium manufacturing method which is an embodiment of the present invention. The aforementioned magnetic recording and reproducing apparatus is a hard disk (drive) apparatus (hereinafter "HDD apparatus").

A magnetic recording and reproducing apparatus 124 is provided with a magnetic recording medium (hereinafter "magnetic disk") 96 manufactured using a magnetic-recording-medium manufacturing method which is an embodiment of the present invention, a medium drive 97 which rotationally drives the magnetic disk 96, a magnetic head 98 which records and reproduces information on the magnetic disk 96, a head drive 99 which drives the magnetic head 98 to a desired position, and a magnetic recording and reproducing signal processing system 100. In the magnetic recording and reproducing signal processing system 100, inputted data is processed, (magnetic) recording signals are sent to the magnetic head 98, and reproducing signals sent from the magnetic head 98 are processed, and data is outputted.

<Magnetic-Recording-Medium Manufacturing Method>

Next, a description is given of a magnetic-recording-medium manufacturing method which is an embodiment of the present invention.

A magnetic-recording-medium manufacturing method which is an embodiment of the present invention includes a step in which a magnetic layer is formed on at least one surface of a non-magnetic substrate (magnetic layer forming step), and a step in which carbon film is formed on the aforementioned magnetic layer using the previously described carbon film forming method (carbon film forming step).

Otherwise, in the present embodiment, the description concerns the case where a magnetic recording medium that is loaded into an HDD apparatus is manufactured using an in-line type film forming apparatus wherein film formation treatments are performed while sequentially conveying substrates that are the subjects of film formation among multiple film formation chambers.

First, a description of the in-line type film forming apparatus is given.

<In-Line Type Film Forming Apparatus>

Figure 7:
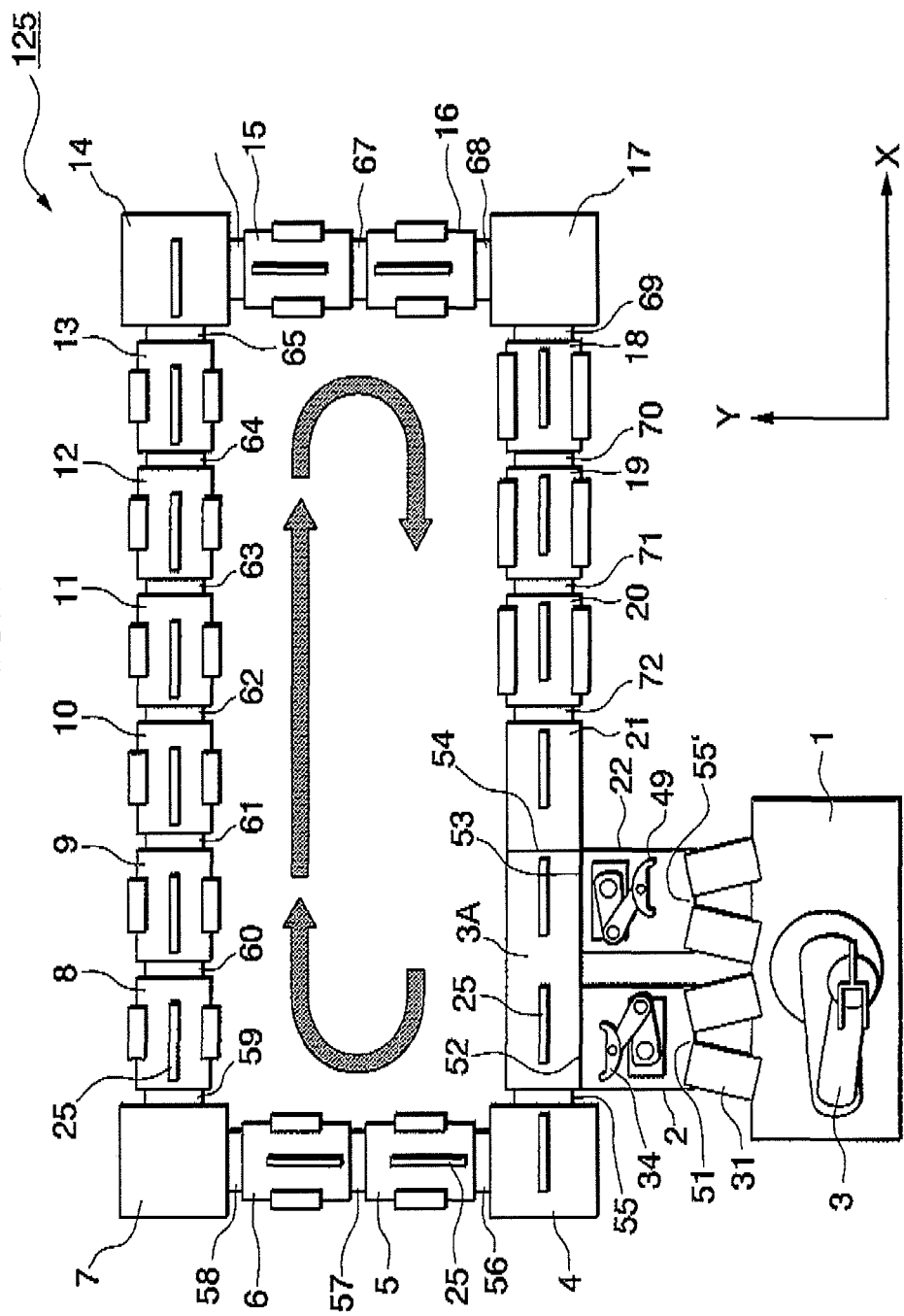
FIG. 7 is a plan view which shows one example of an in-line type film forming apparatus used for the magnetic-recording-medium manufacturing method of the present invention.

FIG. 7 is a plan schematic view which shows one example of an in-line type film forming apparatus (magnetic-recording-medium manufacturing apparatus) using a magnetic-recording-medium manufacturing method which is an embodiment of the present invention.

As shown in FIG. 7, an in-line type film forming apparatus 125 is schematically configured from a robot platform 1, a substrate cassette transfer robot 3 that is mounted on the robot platform 1, a substrate supply robot chamber 2 which is adjacent to the robot platform 1, a substrate supply robot 34 which is disposed inside the substrate supply robot chamber 2, a substrate mounting chamber 52 which is adjacent to the substrate supply robot chamber 2, corner chambers 4, 7, 14 and 17 which rotate carriers 25, treatment chambers 5, 6, 8-13, 15, 16 and 18-21 which are disposed between the respective corner chambers 4, 7, 14 and 17, a substrate removal chamber 53 which is disposed adjacent to the treatment chamber 20, an ashing chamber 3A which is disposed between the substrate mounting chamber 52 and the substrate removal chamber 53, a substrate removal robot chamber 22 which is disposed adjacent to the substrate removal chamber 53, a substrate removal robot 49 which is installed inside the substrate removal robot chamber 22, and multiple carriers 25 which are conveyed among these respective chambers. In addition, code number 31 signifies an airlock chamber for purposes of introducing or ejecting substrates into or from the substrate supply robot chamber 2 and the substrate removal robot chamber 22. Code number 54 signifies a gate valve between the substrate removal chamber and a treatment chamber.

The chambers 2, 52, 4-21, 53 and 3A are respectively connected by two adjacent wall parts, and gate valves 55-72 are provided in the connecting portions of the respective chambers 2, 52, 4-21, 53 and 3A. When the gate valves 55-71 are in a closed state, the interior of each chamber is a respectively independent sealed space. Moreover, vacuum pumps (not illustrated in the drawing) are respectively connected to each chamber 2, 52, 4-20, 53 and 3A, and a state of reduced pressure is established inside each chamber by vacuum pump operation.

The respective corner chambers 4, 7, 14 and 17 are chambers which change the direction of movement of the carriers 25, and their interiors are provided with mechanisms which cause rotation of the carriers 25, and movement to the next film formation chamber.

Each chamber 5, 6, 8-13, 15, 16 and 18-20 is a treatment chamber. Treatment gas supply tubes (not illustrated in the drawing) are connected to the respective treatment chambers, and valves for control of opening and closing are provided in the aforementioned treatment gas supply tubes.

By conducting opening and closing operation of the aforementioned valves and the pump gate valves 55-72, it is possible to control the supply of gas from the treatment gas supply tubes, as well as pressure and gas evacuation in each treatment chamber.

Among the aforementioned treatment chambers, each chamber 5, 6, 8-13, 15 and 16 is a treatment chamber that serves to form the magnetic layer. In these treatment chambers, mechanisms are provided which form the magnetic layer comprising the soft magnetic layer 81, intermediate layer, and recording magnetic layer on both sides of the non-magnetic substrate. The magnetic layer formation step is carried out in these treatment chambers.

Among the aforementioned treatment chambers, each chamber 18-20 is a treatment chamber that serves to form the protective layer. In these treatment chambers, an apparatus is provided which has the same configuration as the film forming apparatus (ion-beam evaporation apparatus) shown in FIG. 1. The carbon film formation step is carried out in these treatment chambers.

Otherwise, one may also add as necessary a treatment chamber for patterning of the mask layer, a treatment chamber for carrying out reactive plasma treatment or ion irradiation treatment, a treatment chamber for removing the mask layer, and so on. By these chambers, it is possible to manufacture a magnetic recording medium of the discrete type shown in FIG. 4.

The substrate cassette transfer robot 3 supplies a non-magnetic substrate from a cassette which stores non-magnetic substrates 80 prior to film formation to the substrate supply robot chamber 2, and withdraws the non-magnetic substrate after film formation (magnetic recording medium) which has been removed by the substrate removal robot chamber 22. On a side wall of the substrate supply robot chamber 2 and the substrate removal robot chamber 22, an opening to the respective airlock chamber, and members 51 and 55' which open and close this opening are provided.

Inside the substrate mounting chamber 52, a non-magnetic substrate prior to film formation is mounted onto the carrier 25 using the substrate supply robot 34. On the other hand, inside the substrate removal chamber 53, the non-magnetic substrate after film formation (magnetic recording medium) mounted on the carrier 25 is removed using the substrate removal robot 49. The ashing chamber 3A conveys the carrier 25 to the substrate mounting chamber 52 after ashing the carrier 25 that was conveyed from the substrate removal chamber 53.

Figure 6:
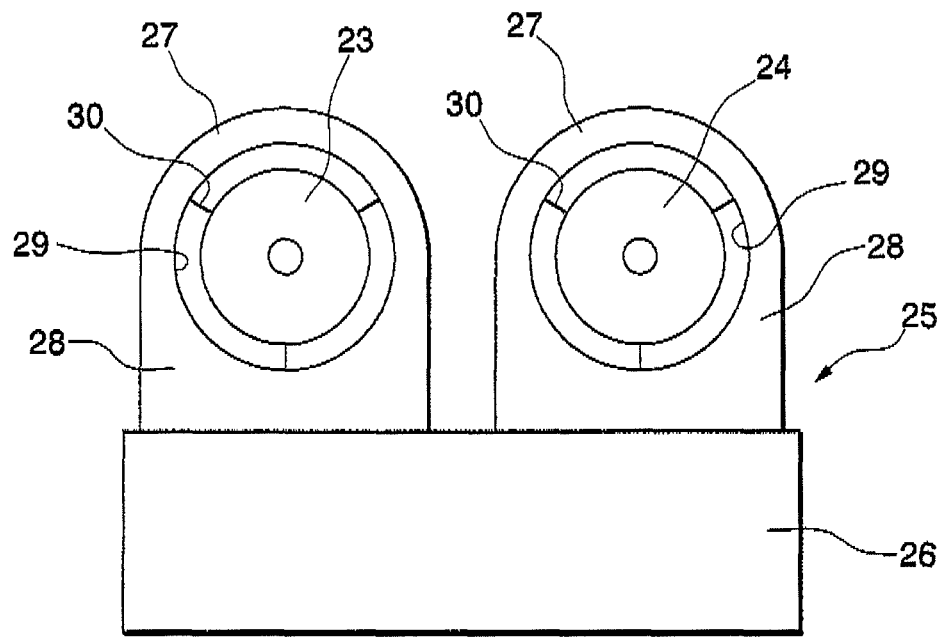
FIG. 6 is an enlarged view of a carrier of an in-line type film forming apparatus.
Figure 8:
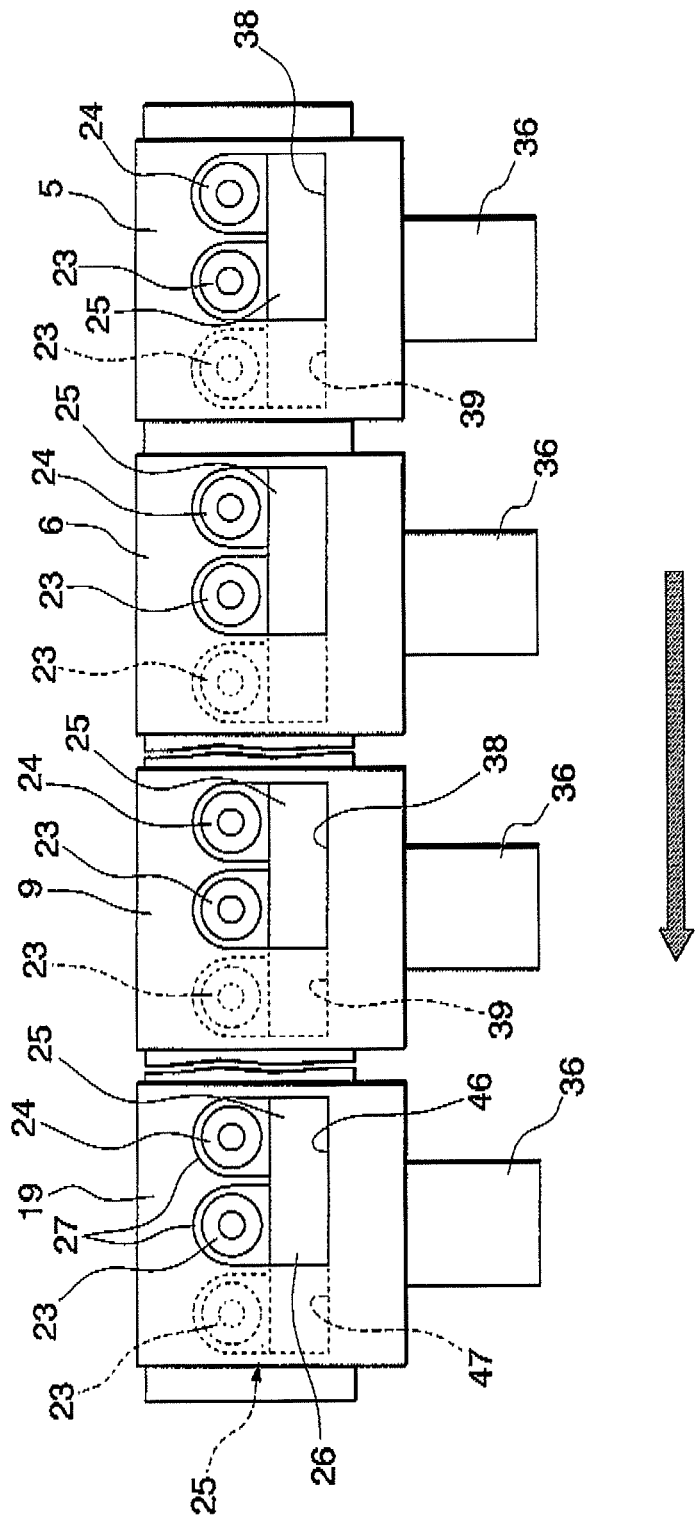
FIG. 8 is a side view which shows one example of carriers of an in-line type film forming apparatus used for the magnetic-recording-medium manufacturing method of the present invention.

FIG. 8 is a side view which shows one example of the carrier of an in-line type film forming apparatus. FIG. 6 is an enlarged side view of the carrier shown in FIG. 8.

As shown in FIG. 6 and FIG. 8, the carrier 25 has a support platform 26, and substrate mounting portions 27 which are provided on the top face of the support platform 26.

Otherwise, two non-magnetic substrates mounted on these substrate mounting portions 27 are respectively shown in the present embodiment as a first film formation substrate 23 and a second film formation substrate 24, since the substrate mounting portions 27 has a double-loading configuration.

The substrate mounting portion 27 is configured to include a plate body 28 having a thickness that is 1-fold to several fold of the thickness of the first and second film formation substrates 23 and 24, a circular through-hole 29 which is a slightly larger than the outer circumference of the film formation substrates 23 and 24, and multiple support members 30 which are provided at the perimeter of the through-hole 29 and which project toward the inner side of the pertinent through-hole 29.

The first and second film formation substrates 23 and 24 are fitted into the through-holes 29, and engage with the support members 30 at the edge, and the film formation substrates 23 and 24 are retained in a vertical position (in a state where the main surfaces of the substrates 23 and 24 are parallel to the direction of gravity). By this structure, the main surfaces of the first and second film formation substrates 23 and 24 that are mounted on the carrier 25 are arranged in alignment on the top face of the support platform 26, so as to be approximately orthogonal to the top face of the support platform 26, and so as to be on approximately the same plane.

As shown in FIG. 8, the respective treatment chambers 5, 6, 9, and 19 are provided with two support platforms 26 which sandwich the carrier 25 in the conveyance direction. Although omitted from FIG. 7, the treatment chambers 8, 10-13, 15, 16, 18, and 20 also have the same configuration. In the drawing, 36 signifies a vacuum pump that serves to evacuate the treatment chamber, 38 and 46 signify carrier stop positions for treatment of the substrate on the left side that is mounted on the carrier, and 39 and 47 signify carrier stop positions for treatment of the substrate on the right side that is mounted on the carrier.

During treatment, first, in a state where, for example, the carver 25 is stopped at a first treatment position shown by the solid lines in FIG. 8, film formation treatment or the like is conducted with respect to the first film formation substrate 23 on the left side of this carrier 25.

Next, the carrier 25 moves to a second treatment position shown by the broken lines in FIG. 7, and film formation treatment or the like is conducted with respect to the second film formation substrate 24 on the right side of the carrier 25 in a state where the carrier 25 is stopped at this second treatment position.

In the case where four treatment apparatuses, which respectively face the first and second film formation substrates 23 and 24, are provided on the both sides that sandwich the carriers 25, there is no need for such a movement of the carriers 25. Film formation treatment or the like can be simultaneously conducted with respect to the first and second film formation substrates 23 and 24 that are held on the carriers 25.

After film formation, the first and second film formation substrates 23 and 24 are removed from the carrier 25, and only the carrier 25 on which carbon film has accumulated is conveyed to the ashing chamber 3A.

Oxygen plasma is then generated inside the ashing chamber 3A using oxygen gas that is introduced from a given place in the ashing chamber 3A.

The aforementioned oxygen plasma contacts the carbon film that has accumulated on the surface of the carrier 25, and the carbon film decomposes into CO or $CO_2$ gas, and is removed.

Next, a description is given of the step in which the aforementioned magnetic recording medium of the discrete type shown in FIG. 4 is manufactured using the aforementioned in-line type film forming apparatus 125 (magnetic-recording-medium manufacturing apparatus) shown in FIG. 7.

First, using the aforementioned in-line type film forming apparatus 125, the non-magnetic substrate 80 is mounted onto the carrier 25, after which the magnetic layer 810 composed of the soft magnetic layer 81, intermediate layer 82 and recording magnetic layer 83, and the protective layer 84 are sequentially laminated onto both sides of this non-magnetic substrate 80 while it is being sequentially conveyed among the multiple treatment chambers.

After formation of the recording magnetic layer 83, reactive plasma treatment or ion irradiation treatment is conducted with respect to this recording magnetic layer 83, whereby the magnetic properties of portions of the recording magnetic layer 83 are modified, preferably being modified from magnetic material to non-magnetic material, and forming the magnetic recording pattern 83a composed of residual magnetic material. Or portions of the recording magnetic layer 83 are removed by etching to form the magnetic recording pattern 83a formed by residual magnetic material.

Figure 9:
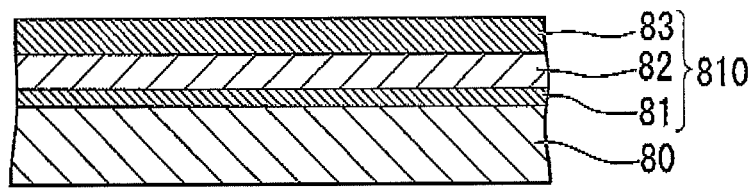
FIG. 9 is a process sectional view which shows an example of the method of manufacture of the magnetic recording medium shown in FIG. 4.

Furthermore, after the aforementioned in-line type film forming apparatus 125 has been used, the lubricating film 85 is formed on the outermost surface of the treatment substrate W after film formation using an application apparatus which is not illustrated in the drawings, thereby enabling obtainment of the aforementioned magnetic recording medium shown in FIG. 9.

Specifically, the aforementioned magnetic recording medium of the discrete type shown in FIG. 4 can be manufactured by carrying out the steps shown in FIG. 9-FIG. 17. With respect to the steps which obtain the magnetic recording medium shown in FIG. 4, it is actually preferable that treatment be conducted simultaneously on both sides of the non-magnetic substrate 80. However, FIG. 9-FIG. 17 illustrate only one side of the non-magnetic substrate 80 on which treatment is performed.

When manufacturing this magnetic recording medium of the discrete type, first, the soft magnetic layer 81 and the intermediate layer 82 are sequentially laminated onto both sides of the non-magnetic substrate 80, after which the recording magnetic layer 83 is formed by the sputtering method, as shown in FIG. 9.

Figure 10:
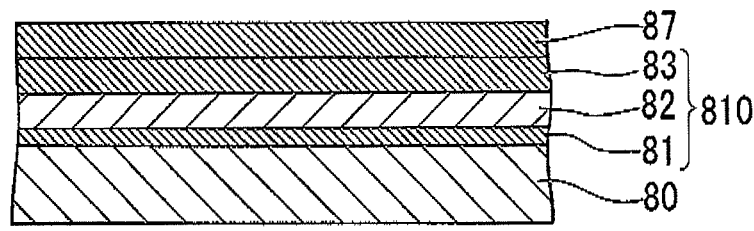
FIG. 10 is a process sectional view which shows an example of the method of manufacture of the magnetic recording medium shown in FIG. 4.

Next, as shown in FIG. 10, a mask layer 87 is formed on the recording magnetic layer 83. In this mask layer 87, it is preferable to use material including any one or two or more types selected from a group consisting of Ta, W, Ta nitride, W nitride, Si, SiO$_2$, Ta$_2$O$_5$, Re, Mo, Ti, V, Nb, Sn, Ga, Ge, As, and Ni. Among these substances, it is preferable to use any one or two or more types selected from As, Ge, Sn, and Ga. It is still more preferable to use any one or two or more types selected from Ni, Ti, V, and Nb, and it is even more preferable to use any one or two or more types selected from Mo, Ta, and W.

By using such material, it is possible to enhance shielding with respect to milling ions by the mask layer 87, and enhance the formative properties of the magnetic recording pattern 83a. Furthermore, as these substances facilitate dry etching using reactive gas, it is possible to reduce residue, and reduce contamination in the surface of the magnetic recording medium during removal of the mask layer 87.

Incidentally, when forming the aforementioned mask layer 87, it is necessary to pattern the mask layer 87 using, for example, a nanoimprinting method, a photolithography method, or the like. That is, when patterning the mask layer 87 by a nanoimprinting method, a photolithography method, or the like, it is difficult to carry out these methods with the in-line type film forming apparatus 125, because there are cases where a liquid resist is used.

Figure 11:
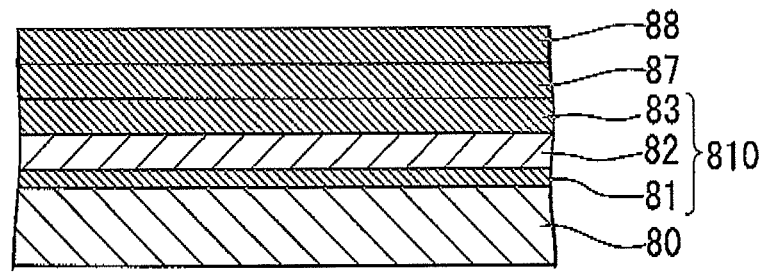
FIG. 11 is a process sectional view which shows an example of the method of manufacture of the magnetic recording medium shown in FIG. 4.

Consequently, in the present embodiment, the non-magnetic substrate 80 on which formation has been conducted up to the recording magnetic layer 83 is removed once from the in-line type film forming apparatus 125. As shown in FIG. 11, with respect to the non-magnetic substrate 80 that has been removed from this in-line type film forming apparatus 125, a resist layer 88 is then formed on the mask layer 87 using a preferred method. For the resist layer 88, it is preferable to use a material that exhibits hardenability due to radiation exposure. For example, one may use ultraviolet curable resin such as ester acrylates and cyclic epoxys, novolac resin, and so on.

Figure 12:
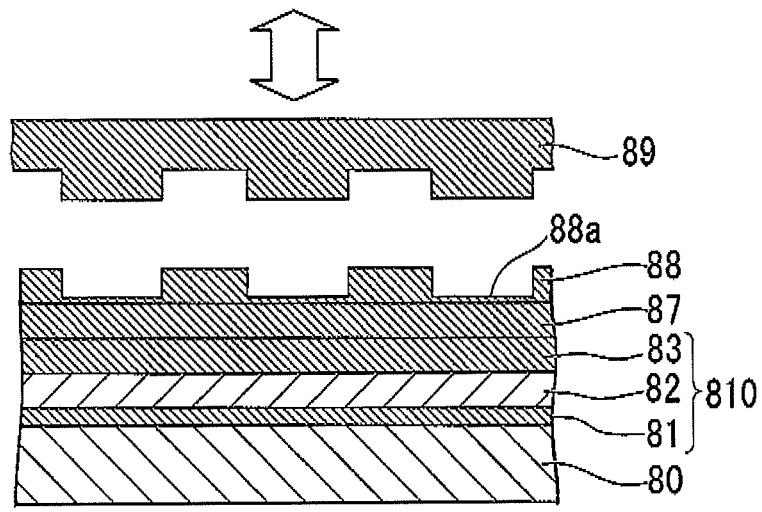
FIG. 12 is a process sectional view which shows an example of the method of manufacture of the magnetic recording medium shown in FIG. 4.

Next, as shown in FIG. 12, the negative pattern of the magnetic recording pattern 83a is transferred to the resist layer 88 using a stamp 89. The arrow mark in FIG. 12 indicates the movement of the stamp 89. In this stamp 89, it is preferable to use glass or resin that is highly permeable to ultraviolet rays. Moreover, with respect to the stamp 89, it is possible to employ a stamp in which a negative pattern is formed corresponding to minute recording tracks on a metal plate of, for example, Ni or the like using a method such as electron beam lithography. There are no particular limitations on the material of the stamp 89, provided that it has hardness and durability which are capable of withstanding the aforementioned process.

During or after the step in which the pattern is transferred to the resist layer 88 using the stamp 89, the resist layer 88 is irradiated with radiation that is selected as desired for purposes of hardening the resist layer 88. The radiation referenced here indicates electromagnetic waves in the wide sense of the term such as heat rays, visible light rays, ultraviolet rays, X-rays, and gamma rays. It may be selected as desired according to the material that is employed. With respect to material which exhibits hardenability due to radiation exposure, there is, for example, thermocurable resin for heat rays, and ultraviolet curable resin for ultraviolet rays.

In particular, with respect to the step in which a pattern is transferred to the resist layer 88 using the stamp 89, it is preferable to impress the stamp 89 on this resist layer 88 in a state where the fluidity of the resist layer 88 is high, and irradiate the resist layer 88 in this impressed state. By this method, it is possible to accurately transfer the form of the stamp 89 to the resist layer 88 by withdrawing the stamp 89 from this resist layer 88 after hardening of the resist layer 88.

The method by which this resist layer 88 is irradiated with radiation in a state where the stamp 89 is impressed upon the resist layer 88 may be selected as desired. For example, there is a method where radiation is projected from the opposite side of the stamp 89, i.e., from the non-magnetic substrate 80 side; a method where radiation-permeable material is selected as the configurative material of the stamp 89, and radiation is projected from this stamp 89 side; a method where radiation is projected from the side faces of the stamp 89; a method where radiation is emitted by thermal conduction via the stamp 89 or the non-magnetic substrate 80 using radiation of high conductivity with respect to a solid material such as hot wire; and so on.

By using such methods, it is possible to accurately transfer the form of the stamp 89 onto the resist layer 88, and in the step in which the mask layer 87 is patterned, sagging in the edge portion of the mask layer 87 can be eliminated, the shielding capability of the mask layer 87 relative to injected ions can be enhanced, and the formative properties of the magnetic recording pattern 83a due to the mask layer 87 can be improved.

It is preferable that thickness of the residual portion 88a of the resist layer 88 after transfer of the pattern to the resist layer 88 using the stamp 89 be within a range of 0-10 nm. By this structure, in the below-described patterning step using the mask layer 87, it is possible to eliminate sagging in the edge portion of the mask layer 87, improve shielding capability relative to milling ions by the mask layer 87, and accurately form recessed portions 83c in the recording magnetic layer 83. Moreover, the formative properties of the magnetic recording pattern 83a due to the mask layer 87 can be improved.

By using the aforementioned stamp 89, in addition to track patterns that record ordinary data, it is also possible to form, for example, servo signal patterns such as burst patterns, gray code patterns, and preamble patterns.

Figure 13:
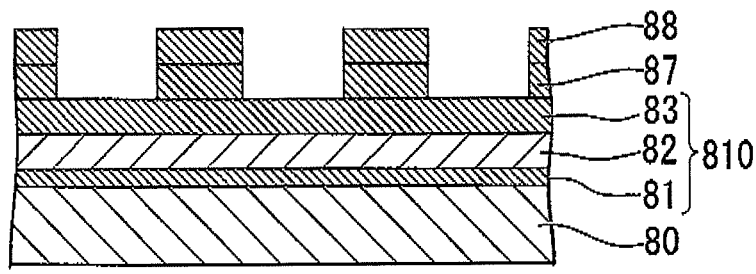
FIG. 13 is a process sectional view which shows an example of the method of manufacture of the magnetic recording medium shown in FIG. 4.

Next, the non-magnetic substrate 80 treated is again introduced into the aforementioned in-line type film forming apparatus 125. After mounting the non-magnetic substrate 80 onto the carrier 4, while the non-magnetic substrate 80 mounted on this carrier 4 is being sequentially transported, the mask layer 87 is subjected to patterning, for example, in a treatment chamber of the aforementioned in-line type film forming apparatus 125 using the resist layer 88 onto which a pattern was transferred, as shown in FIG. 13.

Figure 14:
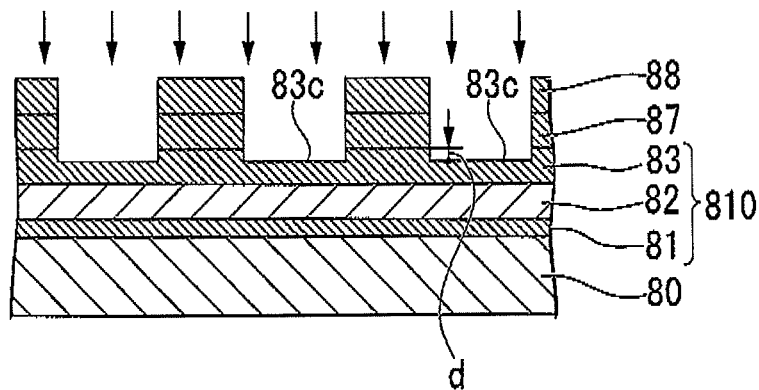
FIG. 14 is a process sectional view which shows an example of the method of manufacture of the magnetic recording medium shown in FIG. 4.

Next, as shown in FIG. 14, recessed portions 83c are formed by partially subjecting the surface of the magnetic recording layer 83 exposed by the patterning of the mask layer 87 to ion milling treatment in a treatment chamber of the aforementioned in-line type film forming apparatus 125. It is preferable that a depth d of the recessed portions 83c provided in this magnetic recording layer 83 be in the range of 0.1 nm to 15 nm; and a range of 1 to 10 nm is more preferable. When removal depth is smaller than 0.1 nm, effects provided by the aforementioned removal of the magnetic recording layer 83 cannot be obtained. When removal depth is greater than 15 nm, the surface smoothness of the magnetic recording medium deteriorates, and the flotation properties of the magnetic head worsen at the time of manufacture of the magnetic recording and reproducing apparatus.

Figure 15:
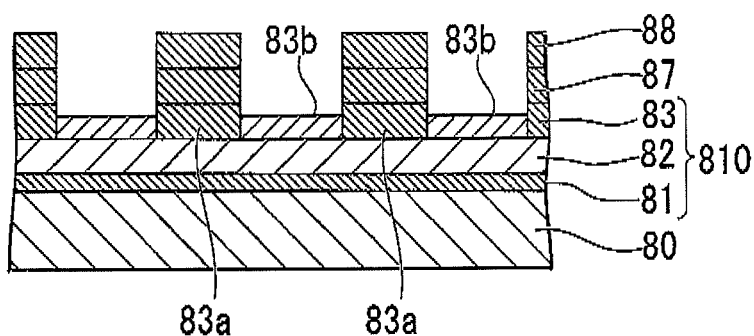
FIG. 15 is a process sectional view which shows an example of the method of manufacture of the magnetic recording medium shown in FIG. 4.

Next, as shown in FIG. 15, the magnetic material configuring the recording magnetic layer 83 is modified to non-magnetic material in three treatment chambers of the aforementioned in-line type film forming apparatus 125 by conducting reactive plasma treatment or reactive ion irradiation treatment with respect to those places in the magnetic recording layer 83 that are not covered by the mask layer 87. By this method, it is possible to form the magnetic recording pattern 83a and the non-magnetic regions 83b in the recording magnetic layer 83.

In the case where the magnetic properties of the recording magnetic layer 83 are modified by exposing the surface of this recording magnetic layer 83 to reactive plasma or reactive ions after provision of the aforementioned recessed portions 83c as in the present embodiment, the contrast of the patterns of the magnetic recording pattern 83a and the non-magnetic regions 83b is sharper than in the case where the surface of the recording magnetic layer 83 is exposed to reactive plasma or reactive ions without provision of the aforementioned recessed portions 83c, enabling improvement of the S/N of the magnetic recording medium. As to the reason for this, it is thought that cleanup and activation of the surface are promoted by removal of the outermost surface portion of the recording magnetic layer 83, raising the reactivity of the reactive plasma or reactive ions, and also that defects such as holes are introduced into the outermost surface portion of the recording magnetic layer 83, and that reactive ions tend to enter the recording magnetic layer 83 through the defects.

The reactive plasma that is employed in the modification to non-magnetic material may be selected as desired, and one may cite inductively coupled plasma (ICP), reactive ion plasma (RIE), and the like. As reactive ions, one may cite the reactive ions existing within the aforementioned inductively coupled plasma or reactive ion plasma.

As inductively coupled plasma, one may cite high-temperature plasma which is obtained such that plasmafication is performed by applying high voltage to gas, and then Joule heat is generated by eddy currents within the plasma by a high-frequency variable magnetic field. Inductively coupled plasma has high electron density, and enables highly efficient modification of magnetic properties over a wide area of the recording magnetic layer 83 compared to the case of manufacture of a magnetic recording medium of the discrete type using conventional ion beams.

Reactive ion plasma is highly reactive plasma in which reactive gas such as $O_2$, $SF_6$, $CHF_3$, $CF_4$, $CCl_4$ or the like has been added to the plasma. By using such plasma, it is possible to achieve modification of the magnetic properties of the recording magnetic layer 83 with a higher degree of efficiency.

In the present invention, the recording magnetic layer 83 is modified by exposing the recording magnetic layer 83 that has been formed to reactive plasma. It is preferable that this modification be achieved by a reaction of the magnetic metal configuring the recording magnetic layer 83 and the atoms or ions in the reactive plasma In this case, examples of the reaction include reactions caused due to infiltration of atoms or the like in the reactive plasma into the magnetic metal, such as; the crystal structure of the magnetic metal is changed; the composition of the magnetic metal is changed; oxidation of the magnetic metal is performed; nitriding of the magnetic metal is performed; silicification of the magnetic metal is performed; and so on.

In particular, it is preferable to oxidize the recording magnetic layer 83 such that oxygen atoms are included in the reactive plasma, and reaction of the oxygen atoms in the reactive plasma and the magnetic metal configuring the recording magnetic layer 83 is caused. By partially oxidizing the recording magnetic layer 83, it is possible to efficiently reduce remanent magnetization as well as magnetic coercive force and the like in the oxidized portion. It is also possible to shorten the time for formation of the magnetic recording pattern 83a by the reactive plasma.

It is also preferable to include halogen atoms in the reactive plasma. As halogen atoms, it is particularly preferable to use F atoms. The halogen atoms may be used by adding them to the reactive plasma together with oxygen atoms, or they may be added to the reactive plasma without use of oxygen atoms. As stated above, by adding oxygen atoms and the like to reactive plasma, it is possible to modify the magnetic properties of the recording magnetic layer 83 by reacting the oxygen atoms and the like with the magnetic metal configuring the recording magnetic layer 83. By having halogen atoms included in the reactive plasma at that time, such a reaction can be further promoted.

On the other hand, even in the case where oxygen atoms are not added to the reactive plasma, it is possible to modify the magnetic properties of the recording magnetic layer 83 by reacting halogen atoms with the magnetic metal. It is particularly preferable to use fluorine in such a reaction. The detailed reasons for this are unclear, but it is thought that the halogen atoms in the reactive plasma etch the impurities that are formed on the surface of the recording magnetic layer 83, whereby the surface of the recording magnetic layer 83 is cleaned, and the reactivity of the recording magnetic layer 83 is enhanced. It is also thought that the surface of the cleaned recording magnetic layer 83 and the halogen atoms react in a highly efficient manner.

Figure 16:
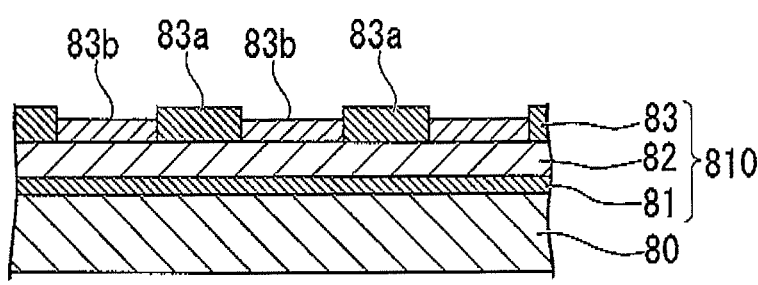
FIG. 16 is a process sectional view which shows an example of the method of manufacture of the magnetic recording medium shown in FIG. 4.

Next, as shown in FIG. 16, after removal of the resist layer 88 in two of the treatment chambers of the aforementioned in-line type film forming apparatus 125, the mask layer 87 is removed in two of the treatment chambers of the aforementioned in-line type film forming apparatus 125. The method of removal of the mask layer 87 and resist layer 88 may be selected as desired, and one may use, for example, dry etching, reactive ion etching, ion milling, wet etching, and so on.

Figure 17:
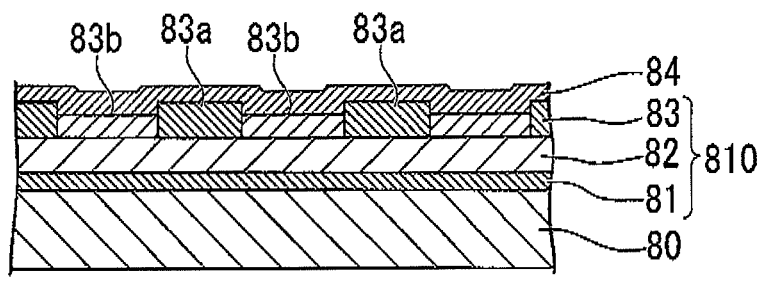
FIG. 17 is a process sectional view which shows an example of the method of manufacture of the magnetic recording medium shown in FIG. 4.

Next, as shown in FIG. 17, the protective layer 84 is formed on the surface of the recording magnetic layer 83 in two of the treatment chambers of the aforementioned in-line type film forming apparatus 125. The above-described carbon film forming method may be used in the formation of this protective layer 84. That is, a protective film composed of carbon film may be formed by disposing the columnar member 133 with clearance from the surface of the non-magnetic substrate 80, evacuating the interior of the film formation chamber, and emitting carbon ions.

After using the aforementioned in-line type film forming apparatus 125, the lubricating film 85 is formed on the outermost surface of the non-magnetic substrate 80 using an application apparatus that is not illustrated in the drawings. As the lubricating agent for use in this lubricating film 85, one may cite fluorolubricants, hydrocarbon lubricants, mixtures of these, and so on. The lubricating film 85 is ordinarily formed to a thickness of 1-4 nm.

By carrying out the aforementioned steps, it is possible to manufacture the aforementioned magnetic recording medium of the discrete type shown in FIG. 4.

The carbon film forming method which is a preferred embodiment of the present invention has a configuration which includes: a step in which—inside a film formation chamber 101 provided with a filamentous cathode electrode 104, an anode electrode 105 disposed around the perimeter of the cathode electrode 104, and a substrate holder 102 disposed at a position that is separated from the cathode electrode 104—a disk-like substrate D that has a central aperture 131c is disposed in the substrate holder so that one surface 131a is opposite the aforementioned cathode electrode 104, and a columnar member that has a diameter $d_1$ equal to or greater than a diameter $d_2$ of the aforementioned central aperture 131c and that has a height l equal to or greater than the aforementioned diameter $d_1$ is disposed with clearance from the aforementioned cathode electrode and the aforementioned substrate so that its central axis $C_2$ is coaxial with a central axis $C_1$ of the substrate D, one of its circular surfaces 133a is oriented toward the cathode electrode 104, and its other circular surface 133b is parallel to the aforementioned surface of the substrate D; and a step in which carbon film is formed on one surface of the substrate D by causing emission of carbon ions from the cathode electrode 104 side toward the substrate D side after the interior of the film formation chamber 101 has been evacuated. Consequently, by rectifying the ion beams and the plasma itself, it is possible to raise plasma density and the concentration of carbon ions that fly to the surface 131a of the substrate D from the direction perpendicular to the surface 131a, prevent wrap-around of carbon ions, and form compact carbon film that has a high degree of planarity and smoothness, and that has high hardness. Moreover, by preventing concentration of ion beams and plasma at the central aperture 131c of the substrate D, and by preventing temperature increases in the portion 131d which is the edge portion of the central aperture 131c of the substrate D, it is possible to reduce the growth speed of carbon film in the portion 131d at the edge of the central aperture 131c of the substrate D, and form compact carbon film that has a high degree of planarity and smoothness, and that has high hardness.

The carbon film forming method which is a preferred embodiment of the present invention has a configuration wherein the central aperture of the aforementioned substrate is circular, and the diameter $d_1$ of the columnar member 133 is from 1-fold or more to less than 1.5-fold of the diameter $d_2$ of the central aperture 131c of the substrate D. Accordingly, it is possible to dispose the columnar member 133 so that only the end portion 131d of the central aperture 131c of the substrate D (edge portion) is shielded, and render the thickness of carbon film in the portion 131d at the edge of the central aperture 131c of the substrate D more planar and smooth.

The carbon film forming method which is a preferred embodiment of the present invention has a configuration wherein the height l of the columnar member 133 is from 3-fold or more to within 6-fold of the diameter $d_1$ of the columnar member 133. Accordingly, it is possible to more prominently obtain the effect of rectifying the ion beams and plasma, better prevent clustering of ion beams and plasma at the central aperture 131c of the substrate D, further raise plasma density and the concentration of carbon ions that fly to the surface 131a of the substrate D from the direction perpendicular to the surface, and form fine carbon film that has a higher degree of planarity and smoothness, and that has high hardness.

The carbon film forming method which is a preferred embodiment of the present invention has a configuration wherein the clearance $d_2$ of the columnar member 133 and the substrate D is from 5 mm or more to 40 mm or less. Accordingly, it is possible to render the thickness of carbon film in the portion 131d which exists at the edge of the central aperture 131c of the substrate D more planar and smooth, and form fine carbon film of high hardness.

The carbon film forming method which is a preferred embodiment of the present invention has a configuration wherein the columnar member 133 is disposed with ungrounded potential. Accordingly, it is possible to arrange matters so that the flight of carbon ions is not prevented, and form fine carbon film that has a high degree of planarity and smoothness and that has high hardness by irradiating the surface 131a of the substrate D with carbon ions from the direction perpendicular to the surface.

The carbon film forming method which is a preferred embodiment of the present invention has a configuration wherein carbon ions that are generated from raw material gas containing carbon by heating of the cathode electrode 104 and by electric discharge between the cathode electrode 104 and anode electrode 105 are accelerated from the cathode electrode 104 side toward the substrate D side to form the aforementioned ion beams by the application of voltage between the substrate D and the cathode electrode 104 or anode electrode 105. Accordingly, it is possible to form compact carbon film that has a high degree of planarity and smoothness, and that has high hardness.

The carbon film forming method which is a preferred embodiment of the present invention has a configuration wherein the aforementioned carbon ions are formed by heating raw material gas containing carbon that has been introduced into the film formation chamber 101 by the cathode electrode 104, and by causing electric discharge between the cathode electrode 104 and anode electrode 105. Accordingly, it is possible to form compact carbon film that has a high degree of planarity and smoothness, and that has high hardness.

The carbon film forming method which is a preferred embodiment of the present invention has a configuration wherein the aforementioned carbon ions are accelerated from the cathode electrode 104 side toward the substrate D side due to the application of voltage between the substrate D and the cathode electrode 104 or anode electrode 105. Accordingly, it is possible to form compact carbon film that has a high degree of planarity and smoothness, and that has high hardness.

The carbon film forming method which is a preferred embodiment of the present invention has a configuration wherein a permanent magnet(s) 109 is disposed so as to surround the anode electrode 105. Accordingly, it is possible to form compact carbon film that has a higher degree of planarity and smoothness, and that has higher hardness.

The magnetic-recording-medium manufacturing method which is a preferred embodiment the present invention has a configuration which includes a step in which the magnetic layer 810 is formed on at least one surface of the non-magnetic recording substrate 80, and a step in which carbon film is formed on the magnetic layer 810 using the previously described carbon film forming method. Accordingly, it is possible to manufacture a magnetic recording medium with high recording density by forming fine carbon film that has a high degree of planarity and smoothness and that has high hardness as the protective film 84, since such a protective film 84 can have thin thickness and can reduce the floatation height of the magnetic head.

The carbon film forming apparatus which is a preferred embodiment of the present invention has a configuration which includes a film formation chamber 101 capable of pressure reduction, a filamentous cathode electrode 104 disposed inside the film formation chamber 101, an anode electrode 105 disposed around the cathode electrode 104, a substrate holder 102 disposed at a position that is separated from the cathode electrode 104, a columnar member 133 disposed between the substrate holder 102 and the cathode electrode 104, a first power source 106 which heats the cathode electrode 104 by energization, a second power source 107 which produces electric discharge between the cathode electrode 104 and the anode electrode 105, and a third power source 108 which imparts a potential difference between the aforementioned substrate holder 102 and the cathode electrode 104 or the anode electrode 105. Consequently, by rectifying the ion beams and the plasma itself, the columnar member 133 is able to raise plasma density and the concentration of carbon ions that fly to the surface 131a of the substrate D from the direction perpendicular to the surface, inhibit wrap-around of carbon ions, and form dense carbon film that has a high degree of planarity and smoothness, and that has high hardness. Moreover, by inhibiting clustering of ion beams and plasma at the central aperture 131c of the substrate D, and prevent temperature increases in the edge portion 131d of the central aperture 131c of the substrate D, it is possible to reduce the growth speed of carbon film at the edge portion 131d of the central aperture 131c of the substrate D, and form dense carbon film that has a high degree of planarity and smoothness, and that has high hardness.

EXAMPLES

The present invention is described below in detail based on embodiments. However, the present invention is not limited to these embodiments alone.

Example 1

First, an aluminum substrate was prepared by performing NiP plating on a disk-like substrate which served as the non-magnetic substrate (hereinafter "substrate") and which had an external diameter of 3.5 inches and an aperture at the center (external diameter: 95 mm, central aperture diameter: 25 mm).

Next, in a treatment chamber provided in the in-line type film forming apparatus shown in FIG. 7, which can be optionally selected, the magnetic layer was formed by sequentially laminating a soft magnetic layer composed of FeCoB with a film thickness of 60 nm, an intermediate layer composed of Ru with a film thickness of 10 nm, and a recording magnetic layer composed of 70Co-5Cr-15Pt-10SiO$_2$ alloy with a film thickness of 15 nm onto both sides of a substrate mounted on a carrier made of A5052 aluminum alloy.

Next, the substrate on which the magnetic layer was formed was conveyed to a treatment chamber which is disposed within the in-line type film forming apparatus shown in FIG. 7 and which has the apparatus configuration similar to the film forming apparatus shown in FIG. 1 on both sides of the substrate.

As the treatment chamber which has the apparatus configuration similar to the film forming apparatus shown in FIG. 1 on both sides of the substrate, a treatment chamber of cylindrical shape was used wherein the material of the chamber wall was SUS304, and which had an external diameter of 180 mm and a length of 250 mm.

A coil-shaped cathode electrode composed of tungsten with a length of approximately 30 mm and a cylindrical anode electrode surrounding the perimeter of the cathode electrode were provided within the treatment chamber. As the anode electrode, an electrode was used whose material was SUS304, and which had an external diameter of 140 mm, and a length of 40 mm.

In addition, a cylindrical permanent magnet was arranged so as to surround the perimeter of the chamber wall. The permanent magnet had an internal diameter of 185 mm and a length of 40 mm, and the anode electrode was disposed at its center, and S pole of the magnet was provided on the substrate side, while its N pole of the magnet was provided on the cathode electrode side. The total magnetic force of this permanent magnet was 50 G (5 mT).

The distance between the cathode electrode and the substrate was set to 160 mm.

A columnar member made of copper with a diameter of 26 mm and a length of 100 mm was then disposed with a clearance of 10 mm from the cathode electrode so that its central axis was coaxial with the central axis of the substrate, and so that one circular surface was oriented toward the cathode electrode, while the other circular surface was parallel to one surface of the substrate. The columnar member was held by three rods made of SUS304 with a diameter of 3 mm that were attached to the treatment chamber wall.

Next, protective layers composed of carbon film were respectively formed as follows on the magnetic layers formed on both sides of the substrate.

First, raw material gas which was gasified toluene was introduced from a gas inlet tube into the film formation chamber under the condition of a gas flow rate of 2.9 SCCM. Carbon film with a thickness of 3.5 nm was then formed on the magnetic layer of the one surface and the other surface of the substrate, respectively, under film formation conditions of a reaction pressure of 0.3 Pa, cathode power of 225 W (AC 22.5 V, 10 A), voltage of 75 V between the cathode electrode and the anode electrode, electric current of 1650 mA, and ion acceleration voltage of 200 V, and 60 mA.

Subsequently, the magnetic recording medium on which the carbon film was formed (Example 1) was removed.

<Film Thickness Measurement>

First, using a conventional film thickness measurement apparatus, average film thickness of the carbon film formed on the two sides of the magnetic recording medium, on which carbon film was formed (Example 1), was measured.

Next, average film thickness of the carbon film of the edge portion of the central aperture of the substrate (at positions on the outer circumferential side at 3 mm from the central aperture of the substrate) was measured.

Average film thickness of the edge portion of the central aperture of the substrate was approximately 4% thicker than the average film thickness of the carbon film.

Examples 2-12

Apart from the conditions shown in Table 1, magnetic recording mediums on which carbon film was formed (Examples 2-12) were manufactured in the same manner as Example 1. Subsequently, film thickness was measured in the same manner as Example 1.

Comparative Example 1

Apart from use of a coin-shaped shield with a height of 3 mm and a diameter of 26 and with a clearance of 10 mm from the cathode electrode, a magnetic recording medium on which carbon film was formed (Comparative Example 1) was manufactured in the same manner as Example 1. Subsequently, film thickness measurement was conducted in the same manner as Example 1. Average film thickness of the edge portion of the central aperture of the substrate was approximately 12% thicker than the average film thickness of the carbon film.

Comparative Example 2

Apart from setting the diameter of the columnar member to 24 mm which was less than the 25 mm diameter of the central aperture of the substrate, a magnetic recording medium on which carbon film was formed (Comparative Example 2) was manufactured in the same manner as Example 1. Subsequently, film thickness was measured in the same manner as Example 1.

The obtained results are summarized in Table 1.

TABLE 1

|  | Substrate | | Columnar member | | Distance between columnar member and substrate (mm) | Average film thickness of edge portion/average film thickness of carbon film |
|---|---|---|---|---|---|---|
|  | External diameter (mm) | Central aperture diameter (mm) | Diameter (mm) | Height (mm) | | |
| Example 1 | 95 | 25 | 26 | 100 | 10 | 1.04 |
| Example 2 | 95 | 25 | 25 | 100 | 10 | 1.07 |
| Example 3 | 95 | 25 | 37.5 | 100 | 10 | 0.97 |
| Example 4 | 95 | 25 | 39 | 100 | 10 | 0.96 |
| Example 5 | 95 | 25 | 26 | 70 | 10 | 1.05 |
| Example 6 | 95 | 25 | 26 | 78 | 10 | 1.06 |
| Example 7 | 95 | 25 | 26 | 156 | 10 | 0.97 |
| Example 8 | 95 | 25 | 26 | 170 | 10 | 0.97 |
| Example 9 | 95 | 25 | 26 | 100 | 3 | 0.95 |
| Example 10 | 95 | 25 | 26 | 100 | 5 | 0.99 |
| Example 11 | 95 | 25 | 26 | 100 | 40 | 1.07 |
| Example 12 | 95 | 25 | 26 | 100 | 45 | 1.08 |
| Comparative Example 1 | 95 | 25 | 26 | 3 | 10 | 1.12 |
| Comparative Example 2 | 95 | 25 | 24 | 100 | 10 | 1.1 |

INDUSTRIAL APPLICABILITY

The carbon film forming method, carbon film forming apparatus, and magnetic-recording-medium manufacturing method of the present invention are able to form fine carbon film that has a high degree of planarity and smoothness, and that has high hardness, and can be applied in industries which manufacture and utilize magnetic recording mediums with enhanced magnetic recording density.

DESCRIPTION OF THE REFERENCE NUMERALS

1: substrate cassette transfer robot platform
2: substrate supply robot chamber
3: substrate cassette transfer robot
3A: ashing chamber
4, 7, 14, 17: corner chamber
5, 6, 8-13, 15, 16, 18-20: treatment chamber
22: substrate removal robot chamber
23: first film formation substrate
24: second film formation substrate
25: carrier
26: support platform
27: substrate mounting portion
28: plate body
29: circular through-hole
30: support member
34: substrate supply robot
49: substrate removal robot
52: substrate mounting chamber
53: substrate removal chamber
55-72: gate valve
80: non-magnetic substrate
81: soft magnetic layer
82: intermediate layer
83: recording magnetic layer
83a: magnetic recording pattern
83b: non-magnetic region
83c: recessed portion
84: protective layer
85: lubricating film
87: mask layer
88: resist layer
88a: residual portion
89: stamp
96: magnetic recording medium (magnetic disk)
97: medium driver
98: magnetic head
99: head drive
100: magnetic recording and reproducing signal processing system
101: film formation chamber
101a: chamber wall
102: substrate holder
103: raw material gas inlet tube
104: cathode electrode
105: anode electrode
106: first power source
107: second power source 108: third power source
109: permanent magnet
110: exhaust tube
121: film forming apparatus
122, 123: magnetic recording medium
124: magnetic recording and reproducing apparatus (HDD apparatus)
125: in-line film forming apparatus
131a: one surface
131b: other surface
131c: central aperture
131d: portion at edge (edge portion)
133: columnar member
133a: one circular surface
133b: other circular surface
810: magnetic layer
B: ion beam (gas containing carbon)
D: substrate
G: raw material gas
M: magnetic line
R: excitation space

The invention claimed is:

1. A carbon film forming method, comprising:
a step in which, inside a film formation chamber provided with a filamentous cathode electrode, an anode electrode disposed around the perimeter of the cathode electrode, and a substrate holder disposed at a position that is separated from the cathode electrode, a disk-like substrate that has a central aperture is disposed in the substrate holder so that one surface of the substrate is opposite the cathode electrode,
and a columnar member that has a diameter equal to or greater than a diameter of the central aperture and that has a height equal to or greater than the diameter of the columnar member is disposed with clearance from the cathode electrode and the substrate, so that central axis of the columnar member is coaxial with a central axis of the substrate, one of circular surfaces of the columnar member faces the cathode electrode, and the other circular surface of the columnar member is parallel to said one surface of the substrate;
and a step in which carbon film is formed on said one surface of the substrate by causing emission of carbon ions from the cathode electrode side toward the substrate side after the interior of the film formation chamber has been evacuated; and
wherein the central aperture of the substrate is circular, and a diameter of the columnar member is 1-fold or more and less than 1.5-fold of a diameter of the central aperture of the substrate.

2. The carbon film forming method according to claim 1, wherein a height of the columnar member is 3-fold or more and 6-fold or less of a diameter of the columnar member.

3. The carbon film forming method according to claim 1, wherein a clearance between the columnar member and the substrate is 5 mm or more and 40 mm or less.

4. The carbon film forming method according to claim 1, wherein the columnar member is disposed with ungrounded potential.

5. The carbon film forming method according to claim 1, wherein raw material gas containing carbon that is introduced into the film formation chamber is heated by the cathode electrode, and the carbon ions are formed by causing electric discharge between the cathode electrode and the anode electrode.

6. The carbon film forming method according to claim 1, wherein the carbon ions are accelerated from the cathode electrode side toward the substrate side by applying voltage between the substrate and the cathode electrode or the anode electrode.

7. The carbon film forming method according to claim 1, wherein a permanent magnet is disposed so as to surround the anode electrode.

8. A magnetic recording medium manufacturing method, comprising:
a step in which a magnetic layer is formed on at least one surface of a non-magnetic substrate, and
a step in which carbon film is formed on the magnetic layer using the carbon film forming method according to claim 1.

9. A carbon film forming apparatus, comprising:
a film formation chamber capable of pressure reduction;
a filamentous cathode electrode disposed inside the film formation chamber;
an anode electrode disposed around a perimeter of the cathode electrode;
a substrate holder disposed at a position that is separated from the cathode electrode, and which holds a disk-like substrate that has a central aperture;
a columnar member disposed between the substrate holder and the cathode electrode wherein the columnar member has a diameter equal to or greater than a diameter of the central aperture of the substrate and has a height equal to or greater than a diameter of the columnar member;
a first power source which heats the cathode electrode by energization;
a second power source which produces electric discharge between the cathode electrode and the anode electrode;
and a third power source which imparts a potential difference between the substrate holder and the cathode electrode or the anode electrode.

10. The carbon film forming apparatus according to claim 9, wherein a diameter of the columnar member is 1-fold or more and less than 1.5-fold of the diameter of the central aperture of the substrate, a height of the columnar member is 3-fold or more and 6-fold or less of the diameter of the columnar member, a clearance between the columnar member and the substrate is 5 mm or more and 40 mm or less, and the columnar member is disposed with ungrounded potential.

11. The carbon film forming apparatus according to claim 10, wherein raw material gas containing carbon that is introduced into the film formation chamber is heated by the cathode electrode, and the carbon ions are formed by causing electric discharge between the cathode electrode and the anode electrode.

12. The carbon film forming apparatus according to claim 10, wherein the carbon ions are accelerated from the cathode electrode side toward the substrate side by applying voltage between the substrate and the cathode electrode or the anode electrode.

13. The carbon film forming apparatus according to claim 10, wherein a permanent magnet is disposed so as to surround the anode electrode.

* * * * *